United States Patent
Ahn et al.

(10) Patent No.: US 12,113,047 B2
(45) Date of Patent: Oct. 8, 2024

(54) INK LEVELING DEVICE AND METHOD OF MANUFACTURING DISPLAY DEVICE USING THE SAME

(71) Applicant: Samsung Display Co., LTD., Yongin-si (KR)

(72) Inventors: Jung Hyun Ahn, Suwon-si (KR); Buem Joon Kim, Hwaseong-si (KR); Won Ho Lee, Suwon-si (KR); Hyun Deok Im, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 407 days.

(21) Appl. No.: 17/545,439

(22) Filed: Dec. 8, 2021

(65) Prior Publication Data

US 2022/0223562 A1    Jul. 14, 2022

(30) Foreign Application Priority Data

Jan. 8, 2021  (KR) .................. 10-2021-0002427

(51) Int. Cl.
*H01L 23/00* (2006.01)
*B41M 5/00* (2006.01)
*H01L 25/16* (2023.01)

(52) U.S. Cl.
CPC ........... *H01L 24/95* (2013.01); *B41M 5/0023* (2013.01); *H01L 24/76* (2013.01); *H01L 25/167* (2013.01); *H01L 24/82* (2013.01); *H01L 2224/7655* (2013.01); *H01L 2224/76655* (2013.01); *H01L 2224/82101* (2013.01); *H01L 2224/95102* (2013.01); *H01L 2224/95145* (2013.01)

(58) Field of Classification Search
CPC ....... H01L 24/95; H01L 24/76; H01L 25/167; H01L 24/82; H01L 2224/7655; H01L 2224/76655; H01L 2224/82101; H01L 2224/95102; H01L 2224/95145; B41M 5/0023

See application file for complete search history.

(56) References Cited

U.S. PATENT DOCUMENTS

| | | | |
|---|---|---|---|
| 7,972,875 B2 * | 7/2011 | Rogers | H01L 31/1868 257/E21.243 |
| 9,765,934 B2 * | 9/2017 | Rogers | H01L 24/24 |
| 10,490,537 B2 * | 11/2019 | Bae | H01L 33/62 |
| 11,842,988 B2 * | 12/2023 | Kim | H01L 25/0753 |
| 2005/0190245 A1 * | 9/2005 | Desie | B41M 5/0047 347/100 |

(Continued)

FOREIGN PATENT DOCUMENTS

| | | |
|---|---|---|
| JP | 2002-107528 | 4/2002 |
| JP | 2009-172499 | 8/2009 |

(Continued)

*Primary Examiner* — Paul R Durand
*Assistant Examiner* — Michael J. Melaragno
(74) *Attorney, Agent, or Firm* — KILE PARK REED & HOUTTEMAN PLLC

(57) ABSTRACT

An ink leveling device includes a stage on which a target substrate is disposed, base frames disposed at sides of the stage, moving members coupled to the base frames and movable upward and downward, and at least one plate coupled to the moving members and disposed to press the target substrate. Light-emitting element ink is disposed on the target substrate.

20 Claims, 26 Drawing Sheets

(56) References Cited

U.S. PATENT DOCUMENTS

| | | | | |
|---|---|---|---|---|
| 2005/0214963 | A1* | 9/2005 | Daniels | H01L 31/1876 257/E25.02 |
| 2006/0128057 | A1* | 6/2006 | Lu | H01L 21/67271 257/E21.705 |
| 2006/0211183 | A1* | 9/2006 | Duan | H01L 29/78684 438/149 |
| 2013/0027488 | A1* | 1/2013 | Tsunoya | B41M 7/0081 347/102 |
| 2013/0285032 | A1* | 10/2013 | Nanno | H05B 33/10 438/46 |
| 2018/0269174 | A1* | 9/2018 | Fathi | B22F 10/12 |
| 2019/0058080 | A1* | 2/2019 | Ahmed | H01L 24/00 |
| 2019/0244985 | A1* | 8/2019 | Kim | H01L 27/124 |
| 2019/0284408 | A1* | 9/2019 | Suenaga | C09D 11/107 |
| 2019/0284409 | A1* | 9/2019 | Matsushita | B41M 7/0081 |
| 2020/0032068 | A1* | 1/2020 | Yamaguchi | C08F 220/58 |
| 2020/0032084 | A1* | 1/2020 | Fujii | C09D 11/102 |
| 2020/0032089 | A1* | 1/2020 | Kobayashi | B41J 11/002 |
| 2020/0231833 | A1* | 7/2020 | Kojima | B41J 11/00214 |
| 2020/0411489 | A1* | 12/2020 | Ahmed | H01L 33/42 |
| 2020/0411490 | A1* | 12/2020 | Ahmed | H01L 29/78678 |
| 2020/0411491 | A1* | 12/2020 | Ahmed | H01L 33/502 |
| 2020/0411717 | A1* | 12/2020 | Keates | H01L 33/0095 |
| 2021/0057610 | A1* | 2/2021 | Yang | H10K 59/353 |
| 2021/0202452 | A1* | 7/2021 | Kim | H01L 24/24 |
| 2021/0367024 | A1* | 11/2021 | Kim | H10K 59/123 |
| 2022/0045241 | A1* | 2/2022 | Kim | H01L 33/005 |
| 2022/0052033 | A1* | 2/2022 | Lee | H01L 33/62 |
| 2022/0223562 | A1* | 7/2022 | Ahn | H01L 24/95 |
| 2023/0011658 | A1* | 1/2023 | Han | H01L 33/38 |
| 2023/0026527 | A1* | 1/2023 | Jung | H10K 85/30 |
| 2023/0155077 | A1* | 5/2023 | Park | H01L 25/167 257/318 |
| 2023/0170336 | A1* | 6/2023 | Jung | H01L 24/95 257/79 |
| 2023/0246136 | A1* | 8/2023 | Park | H01L 25/167 |
| 2023/0275199 | A1* | 8/2023 | Choi | H01L 33/382 |

FOREIGN PATENT DOCUMENTS

| | | |
|---|---|---|
| KR | 10-1628345 | 6/2016 |
| KR | 10-2020-0084476 | 7/2020 |
| KR | 10-2020-0098766 | 8/2020 |

* cited by examiner

INK LEVELING DEVICE AND METHOD OF MANUFACTURING DISPLAY DEVICE USING THE SAME

CROSS REFERENCE TO RELATED APPLICATION(S)

This application claims priority to and benefits of Korean Patent Application No. 10-2021-0002427 under 35 U.S.C. § 119, filed on Jan. 8, 2021, in the Korean Intellectual Property Office, the entire contents of which are incorporated herein by reference.

BACKGROUND

1. Field of Disclosure

The disclosure relates to an ink leveling device and a method of manufacturing a display device using the same.

2. Description of the Related Art

The importance of display devices is increasing with the development of multimedia. Accordingly, various types of display devices such as an organic light-emitting display (OLED) device and a liquid crystal display (LCD) device are being used.

A display device displays an image and includes a display panel such as an OLED panel or an LCD panel. Display devices may include light-emitting display panels, and the light-emitting display panels may include a light-emitting element. For example, light-emitting diodes (LED) may include organic LEDs that use organic materials as the light emitting material, or an inorganic LEDs that use inorganic materials as the light emitting material, or the like.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide an ink leveling device capable of uniformly aligning light-emitting elements by leveling light-emitting element ink sprayed onto a substrate, and a method of manufacturing a display device using the same.

It should be noted that objects of the disclosure are not limited to the above-described objects, and other objects of the disclosure will be apparent to those skilled in the art from the following descriptions.

According to an embodiment of the disclosure, the ink leveling device may comprise a stage on which a target substrate is disposed, base frames disposed at sides of the stage, moving members coupled to the base frames and movable upward and downward, and at least one plate coupled to the moving members and disposed to press the target substrate. Light-emitting element ink may be disposed on the target substrate.

In an embodiment, each of the moving members may include a moving part coupled to each of the base frames, and a fixing part coupled to the moving part and disposed to fix the at least one plate.

In an embodiment, the moving members may move upward and downward in a length direction of the base frame.

In an embodiment, the at least one plate may move upward and downward according to upward and downward movement of the moving members to press the target substrate.

In an embodiment, a size of the at least one plate may be greater than a size of the target substrate.

In an embodiment, the at least one plate may be provided in plural. A size of each of the plurality of plates may be smaller than a size of the target substrate.

In an embodiment, each of the moving members may include a moving part coupled to each of the base frames, a supporting part coupled to the moving part and moving according to movement of the moving part, and at least one fixing part extending from the supporting part and disposed to fix the at least one plate.

In an embodiment, the at least one fixing part may be provided in plural, and the plurality of fixing parts may be coupled to the plurality of plates, respectively.

According to an embodiment of the disclosure, a method of manufacturing a display device may comprise disposing light-emitting element ink including light-emitting elements on a target substrate, pressing the target substrate by moving a plate, aligning the light-emitting elements by forming an electric field on the target substrate and irradiating ultraviolet light on the target substrate, and separating the plate from the target substrate.

In an embodiment, the light-emitting element ink may include a solvent and the light-emitting elements dispersed in the solvent. The disposing of the light-emitting element ink on the target substrate may include inkjet printing.

In an embodiment, the target substrate may include first patterns formed in parallel, a first electrode and a second electrode disposed on the first patterns, a first insulating layer covering the first electrode and the second electrode, and second patterns disposed on the first insulating layer and that partition a predetermined area.

In an embodiment, in the aligning of the light-emitting elements may include generating the electric field by the first electrode and the second electrode, and disposing end portions of each of the light-emitting elements on the first electrode and the second electrode, respectively, by use of the electric field.

In an embodiment, the pressing of the target substrate may include moving a moving member downward to the target substrate such that a plate coupled to the moving member contacts the target substrate, and pressing the target substrate and the light-emitting element ink by the plate.

In an embodiment, the plate may contact the second patterns of the target substrate and the light-emitting element ink. The light-emitting element ink may be leveled between the second patterns by the pressing of the plate.

In an embodiment, the separating of the plate from the target substrate may include moving the moving member upward to separate the plate coupled to the moving member from the target substrate.

In an embodiment, a size of the plate may be greater than a size of the target substrate.

In an embodiment, a plurality of plates may be coupled to the moving member. A total size of the plurality of plates may be great than a size of the target substrate.

According to an embodiment of the disclosure, the method of manufacturing a display device may comprise disposing light-emitting element ink including light-emitting elements on a target substrate, sequentially pressing areas of the target substrate for by moving a plate, separating the plate from the target substrate, and aligning the light-emitting elements by forming an electric field on the target substrate and irradiating ultraviolet light.

In an embodiment, a size of the plate may be smaller in size than the target substrate. The areas of the target substrate may be sequentially pressed from one side of the target substrate to another side of the target substrate.

In an embodiment, the aligning of the light-emitting elements may be performed after the separating of the plate from the target substrate.

BRIEF DESCRIPTION OF THE DRAWINGS

The above and other aspects and features of the disclosure will become more apparent by describing embodiments thereof in detail with reference to the attached drawings, in which.

DETAILED DESCRIPTION OF THE EMBODIMENTS

Figure 1:
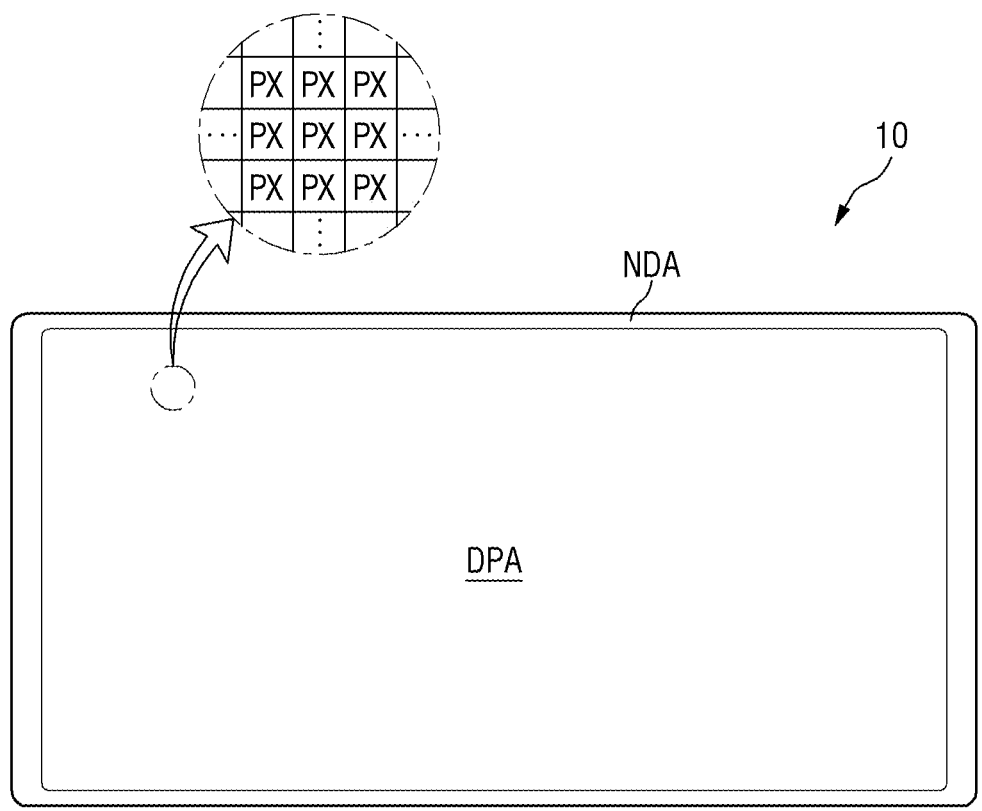
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

In the drawings, sizes, thicknesses, ratios, and dimensions of the elements may be exaggerated for ease of description and for clarity. Like numbers refer to like elements throughout.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined with each other, in part or in whole using a variety of techniques. Each embodiment may be implemented independently or may be implemented together.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the value as determined by one of ordinary skill in the art, considering the measurement in question and the error associated with measurement of the quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, specific embodiments will be described with reference to the accompanying drawings.

FIG. 1 is a schematic plan view of a display device according to an embodiment.

Referring to FIG. 1, a display device 10 may display a video or a still image. The display device 10 may refer to any electronic devices that provide a display screen. For example, the display device 10 may include a television, a notebook, a monitor, an advertising board, an Internet of Things (IoT) device, a mobile phone, a smart phone, a tablet personal computer (PC), an electronic watch, a smart watch, a watch phone, a head mounted display, a mobile communication terminal, an electronic organizer, an electronic book reader, a portable multimedia player (PMP), a navigation device, a game machine, a digital camera, a camcorder, and the like, which provide a display screen.

The display device 10 may include a display panel that provides a display screen. Examples of the display panel may include an inorganic light-emitting diode display panel, an organic light-emitting display panel, a quantum dot light-emitting display panel, a plasma display panel, a field emission display panel, and the like. Hereinafter, although the disclosure describes an inorganic light-emitting diode display panel as an example, the disclosure is not limited thereto, and may be applied to other display panels.

A first direction DR1, a second direction DR2, and a third direction DR3 may be defined in the drawings for describing the display device 10. The first direction DR1 and the second direction DR2 may be directions perpendicular to each other in a plane. The third direction DR3 may be a direction perpendicular to the plane defined by the first direction DR1 and the second direction DR2. The third direction DR3 is perpendicular to each of the first direction DR1 and the second direction DR2. In embodiments for describing the display device 10, the third direction DR3 indicates a thickness direction of the display device 10.

A shape of the display device 10 may be modified in a variety of ways. For example, the display device 10 may have a rectangular shape having long sides in the first direction DR1, which are longer than sides in the second direction DR2, in a plan view. As another example, the display device 10 may also have a rectangular shape having long sides in the second direction DR2, which are longer than sides in the first direction DR1, in a plan view. However, the disclosure is not limited thereto, and the display device 10 may also have other shapes such as a square shape, a quadrilateral shape with rounded corners (vertices), other polygonal shapes, a circular shape, and the like. A shape of a display area DPA of the display device 10 may also be similar to the overall shape of the display device 10. In FIG. 1, the display device 10 and the display area DPA are illustrated as having a rectangular shape in which sides in the first direction DR1 are longer than sides in the second direction DR2.

The display device 10 may include the display area DPA and a non-display area NDA. The display area DPA is an area in which an image may be displayed, and the non-display area NDA is an area in which an image is not displayed. The display area DPA may refer to an active area and the non-display area NDA may refer to an inactive area. The display area DPA may generally occupy a center of the display device 10.

The display area DPA may include pixels PX. The pixels PX may be arranged in a matrix form. A shape of each of the pixels PX may be a rectangular shape or a square shape in a plan view, but the disclosure is not limited thereto, and the shape may be a rhombus shape of which each side is inclined with respect to one direction. The pixels PX may be alternately arranged in a stripe type or a PenTile® type. Each of the pixels PX may include one or more light-emitting elements 30 that emit light in a specific wavelength band, thereby displaying a specific color.

The non-display area NDA may be disposed around the display area DPA. The non-display area NDA may completely or partially surround the display area DPA. The display area DPA has a rectangular shape, and the non-display area NDA may be disposed adjacent to four sides of the display area DPA. The non-display area NDA may form a bezel of the display device 10. In each non-display area NDA, lines or circuit driving parts included in the display device 10 may be disposed, or external devices may be mounted.

Figure 2:
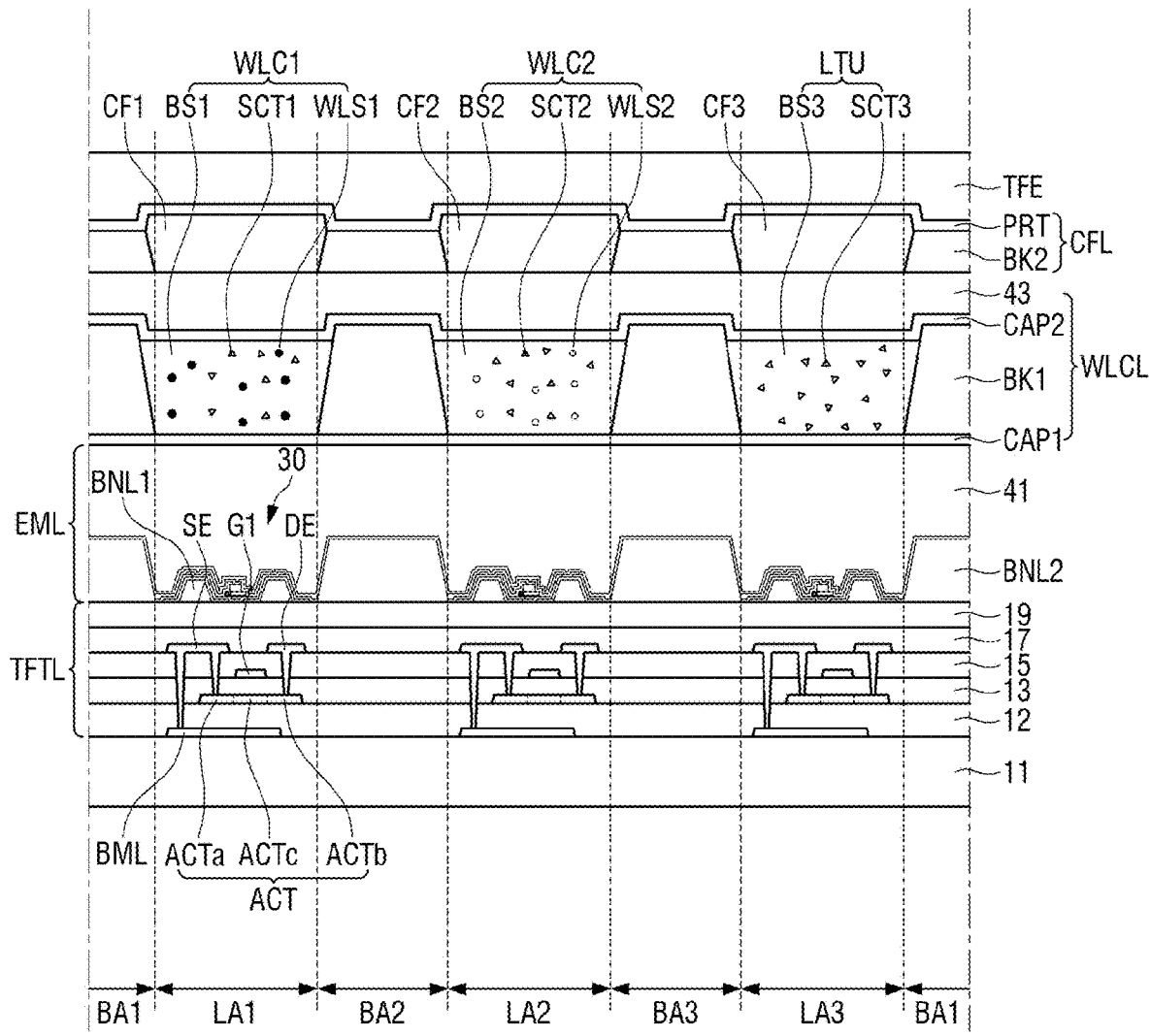
FIG. 2 is a cross-sectional view schematically illustrating some subpixels of the display device according to an embodiment.

FIG. 2 is a cross-sectional view schematically illustrating some subpixels of the display device according to an embodiment.

Referring to FIG. 2, the display area DPA of the display device 10 may include first to third light-emitting areas LA1, LA2, and LA3. Each of the first to third light-emitting areas LA1, LA2, and LA3 may be an area through which light generated by the light-emitting elements 30 of the display device 10 is emitted to the outside of the display device 10.

The display device 10 may include a substrate 11, a buffer layer 12, a transistor layer TFTL, a light-emitting element layer EML, a wavelength conversion layer WLCL, a color filter layer CFL, and an encapsulation layer TFE.

The substrate 11 may be a base substrate or a base member and may be made of an insulating material such as a polymer resin. For example, the substrate 11 may be a flexible substrate that is bendable, foldable, rollable, and the like. The substrate 11 may include polyimide (PI), but the disclosure is not limited thereto.

The buffer layer 12 may be disposed on the substrate 11. The buffer layer 12 may be made of an inorganic film capable of preventing the permeation of air or moisture. For example, the buffer layer 12 may include inorganic films that are alternately stacked.

The transistor layer TFTL may be disposed on the buffer layer 12. The transistor layer TFTL may include a first transistor T1, a gate insulating layer 13, a first interlayer insulating layer 15, a second interlayer insulating layer 17, and a first planarization layer 19.

The first transistor T1 may be disposed on the buffer layer 12, and may constitute a pixel circuit of each of the pixels. For example, the first transistor T1 may be a driving transistor or a switching transistor of the pixel circuit. The first transistor T1 may include an active layer ACT, a gate electrode G1, a source electrode SE, and a drain electrode DE. The active layer ACT may include a conductive areas ACTa and ACTb and a channel area ACTc interposed therebetween.

The light-emitting element layer EML may be disposed on the transistor layer TFTL. The light-emitting element layer EML may include a first pattern BNL1, the light-emitting element 30, and a second pattern BNL2. The light-emitting element 30 may be disposed on the first transistor T1. The light-emitting element 30 may be disposed between a first electrode and a second electrode and connected to each of a first connection electrode and a second connection electrode.

The transistor layer TFTL and the light-emitting element layer EML, which are described above, will be described in more detail below with reference to FIGS. 3 to 5.

A second planarization layer 41 may be disposed on the light-emitting element layer EML to planarize an upper end of the light-emitting element layer EML. The second planarization layer 41 may include an organic material. For example, the second planarization layer 41 may include at least one of an acrylic resin, an epoxy resin, a phenolic resin, a polyamide resin, and a polyimide resin.

The wavelength conversion layer WLCL may include a first capping layer CAP1, a first light-blocking member BK1, a first wavelength conversion part WLC1, a second wavelength conversion part WLC2, a light-transmitting part LTU, a second capping layer CAP2, and a third planarization layer 43.

The first capping layer CAP1 may be disposed on the second planarization layer 41 of the light-emitting element layer EML. The first capping layer CAP1 may seal lower surfaces of the first and second wavelength conversion parts WLC1 and WLC2 and the light-transmitting part LTU. The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The first light-blocking member BK1 may be disposed on the first capping layer CAP1 in first to third light-blocking areas BA1, BA2, and BA3. The first light-blocking member BK1 may overlap the second pattern BNL2 in the thickness direction. The first light-blocking member BK1 may block the transmission of light. The first light-blocking member BK1 may prevent light from penetrating between the first to third light-emitting areas LA1, LA2, and LA3 to prevent the mixing of colors, thereby improving color reproduction (color gamut). The first light-blocking member BK1 may be disposed in the form of a grid that surrounds the first to third light-emitting areas LA1, LA2, and LA3 in a plan view.

The first light-blocking member BK1 may include an organic light-blocking material and a liquid-repellent component. Here, the liquid-repellent component may include a fluorine-containing monomer or a fluorine-containing polymer, for example, a fluorine-containing aliphatic polycarbonate. The first light-blocking member BK1 may include a black organic material including a liquid-repellent component. The first light-blocking member BK1 may be formed through coating and exposure processes for an organic light-blocking material including a liquid-repellent component.

By including the liquid-repellent component, the first light-blocking member BK1 may separate the first and second wavelength conversion parts WLC1 and WLC2 and the light-transmitting part LTU according to a corresponding light-emitting area LA. For example, in a case in which the first and second wavelength conversion parts WLC1 and WLC2 and the light-transmitting part LTU are formed using an inkjet method, ink compositions may flow on an upper surface of the first light-blocking member BK1. By including the liquid-repellent component, the first light-blocking member BK1 may guide the ink compositions to flow into the respective light-emitting areas. Accordingly, the first light-blocking member BK1 may prevent the ink compositions from being mixed.

The first wavelength conversion part WLC1 may be disposed on the first capping layer CAP1 in the first light-emitting area LA1. The first wavelength conversion part WLC1 may be surrounded by the first light-blocking member BK1. The first wavelength conversion part WLC1 may include a first base resin BS1, a first scatterer SCT1, and a first wavelength shifter WLS1.

The first base resin BS1 may include a material having relatively high light transmittance. The first base resin BS1 may be made of a transparent organic material. For example, the first base resin BS1 may include at least one of organic materials such as an epoxy-based resin, an acrylic-based resin, a cardo-based resin, and an imide-based resin.

The first scatterer SCT1 may have a refractive index different from that of the first base resin BS1, and may form an optical interface with the first base resin BS1. For example, the first scatterer SCT1 may include light scattering materials or light scattering particles that scatter at least a portion of transmitted light. For example, the first scatterer SCT1 may include metal oxide particles such as titanium oxide ($TiO_2$), zirconium oxide ($ZrO_2$), aluminum oxide ($Al_xO_y$), indium oxide ($In_2O_3$), zinc oxide (ZnO), or tin oxide ($SnO_2$) or may include organic particles such as an acrylic-based resin or a urethane-based resin. The first scatterer SCT1 may scatter incident light in random directions regardless of an incidence direction of the incident light, while substantially not converting a peak wavelength of the incident light.

The first wavelength shifter WLS1 may convert or shift a peak wavelength of incident light to a first peak wavelength. For example, the first wavelength shifter WLS1 may convert blue light provided from the display device 10 into red light, which has a single peak wavelength ranging from about 610 nm to about 650 nm. The first wavelength shifter WLSI may emit a red light. The first wavelength shifter WLS1 may be a quantum dot, a quantum rod, or a phosphor. The quantum dot may be a particulate material that emits light of a specific color while an electron transitions from a conduction band to a valence band.

For example, the quantum dot may be a semiconductor nanocrystal material. The quantum dot may have a specific band gap according to the composition and size thereof. Thus, the quantum dot may absorb light and then emit light having an intrinsic wavelength. Examples of the semiconductor nanocrystals of the quantum dot may include group IV nanocrystals, group II-VI compound nanocrystals, group III-V compound nanocrystals, group IV-VI compound nanocrystals, and a combination thereof.

For example, the quantum dot may have a core-shell structure that includes a core including the nanocrystals described above and a shell surrounding the core. The shell of the quantum dot may serve as a protective layer for maintaining semiconductor characteristics by preventing chemical modification of the core and as a charging layer for giving electrophoretic characteristics to the quantum dot. The shell may include a single layer or a multi-layer. An interface between the core and the shell may have a concentration gradient where the elements in the shell are less concentrated toward the center. The shell of the quantum dot may be made of metal or non-metal oxide, a semiconductor compound, or a combination thereof.

Light emitted from the first wavelength shifter WLS1 may have a full width of half maximum (FWHM) of an emission wavelength spectrum of about 45 nm or less, about 40 nm or less, or about 30 nm or less. Thus, the purity and reproducibility of a color displayed by the display device 10 may be further improved. The light emitted from the first wavelength shifter WLS1 may be emitted in various directions regardless of the incident direction of incident light. Accordingly, it is possible to improve the lateral visibility of the red light displayed in the first light-emitting area LA1.

A portion of the blue light provided from the light-emitting element layer EML may be transmitted through the first wavelength conversion part WLC1 without being converted into red light by the first wavelength shifter WLS1. Among the blue light provided from the light-emitting element layer EML, light incident on a first color filter CF1 without being converted by the first wavelength conversion part WLC1 may be blocked by the first color filter CF1. Among the blue light provided from the light-emitting element layer EML, the red light, which is converted by the first wavelength conversion part WLC1, may be transmitted through the first color filter CF1 and may be emitted to the outside. Accordingly, the first light-emitting area LA1 may emit the red light.

The second wavelength conversion part WLC2 may be disposed on the first capping layer CAP1 in the second light-emitting area LA2. The second wavelength conversion part WLC2 may be surrounded by the first light-blocking member BK1. The second wavelength conversion part WLC2 may include a second base resin BS2, a second scatterer SCT2, and a second wavelength shifter WLS2.

The second base resin BS2 may include a material having relatively high light transmittance. The second base resin BS2 may be made of a transparent organic material. For example, the second base resin BS2 and first base resin BS1 may include a same material or may be made of a material selected from among the materials of the first base resin BS1.

The second scatterer SCT2 may have a refractive index different from that of the second base resin BS2 and may form an optical interface with the second base resin BS2. For example, the second scatterer SCT2 may include light scattering materials or light scattering particles that scatter at least a portion of the transmitted light. For example, the second scatterer SCT2 and the first scatterer SCT1 may include a same material or may be made of a material selected from among the materials of the first scatterer SCT1. The second scatterer SCT2 may scatter incident light in random directions regardless of an incidence direction of the incident light, while substantially not converting a peak wavelength of the incident light.

The second wavelength shifter WLS2 may convert or shift a peak wavelength of the incident light to a second peak wavelength different from the first peak wavelength of the first wavelength shifter WLS1. For example, the second wavelength shifter WLS2 may convert blue light provided from the display device 10 to green light, which has a single peak wavelength ranging from about 510 nm to about 550 nm and emit the green light. The second wavelength shifter WLS2 may be a quantum dot, a quantum rod, or a phosphor. The second wavelength shifter WLS2 may include a material having the same effect as the material for the first wavelength shifter WLS1. The second wavelength shifter WLS2 may be made of a quantum dot, a quantum rod, or a phosphor so that a wavelength conversion range of the second wavelength shifter WLS2 is different from a wavelength conversion range of the first wavelength shifter WLS1.

The light-transmitting part LTU may be disposed on the first capping layer CAP1 in the third light-emitting area LA3. The light-transmitting part LTU may be surrounded by the first light-blocking member BK1. The light-transmitting part LTU may transmit the incident light while maintaining the peak wavelength of the incident light. The light-transmitting part LTU may include a third base resin BS3 and a third scatterer SCT3.

The third base resin BS3 may include a material having relatively high light transmittance. The third base resin BS3 may be made of a transparent organic material. For example, the third base resin BS3, first base resin BS1, and second base resin BS2 may include a same material or the third base resin BS3 may be made of a material selected from the materials of the first base resin BS1 or the second base resin BS2.

The third scatterer SCT3 may have a refractive index different from that of the third base resin BS3, and the third scatterer SCT3 may form an optical interface with the third base resin BS3. For example, the third scatterer SCT3 may include light scattering materials or light scattering particles that scatter at least a portion of the transmitted light. For example, the third scatterer SCT3 may include the same material as the first scatterer SCT1 or the second scatterer SCT2 or may be made of a material selected from among the materials of the first scatterer SCT1 and the second scatterer SCT2. The third scatterer SCT3 may scatter incident light in random directions regardless of an incidence direction of the incident light, while substantially not converting a peak wavelength of the incident light.

The wavelength conversion layer WLCL may be disposed directly on the second planarization layer 41 of the light-emitting element layer EML. Thus, the display device 10 may not require a separate substrate for the first and second wavelength conversion parts WLC1 and WLC2 and the light-transmitting part LTU. Accordingly, the first and second wavelength conversion parts WLC1 and WLC2 and the light-transmitting part LTU may be easily aligned with the first to third light-emitting areas LA1, LA2, and LA3, respectively, and the thickness of the display device 10 may be relatively reduced.

The second capping layer CAP2 may cover the first and second wavelength conversion parts WLC1 and WLC2, the light-transmitting part LTU, and the first light-blocking member BK1. For example, the second capping layer CAP2 may seal the first and second wavelength conversion parts WLC1 and WLC2 and the light-transmitting part LTU to prevent damage to or contamination of the first and second wavelength conversion parts WLC1 and WLC2 and the light-transmitting part LTU. The second capping layer CAP2 may be made of the same material as the first capping layer CAP1 or may be made of a material selected from among the materials of the first capping layer CAP1.

The third planarization layer 43 may be disposed on the second capping layer CAP2 to planarize upper ends of the first and second wavelength conversion parts WLC1 and WLC2 and the light-transmitting part LTU. The third planarization layer 43 may include an organic material. For example, the third planarization layer 43 may include at least one among an acrylic resin, an epoxy resin, a phenolic resin, a polyamide resin, and a polyimide resin.

The color filter layer CFL may include a second light-blocking member BK2, first to third color filters CF1, CF2, and CF3, and a protective layer PRT.

The second light-blocking member BK2 may be disposed on the third planarization layer 43 of the wavelength conversion layer WLCL in the first to third light-blocking areas BA1, BA2, and BA3. The second light-blocking member BK2 may overlap the first light-blocking member BK1 or the second pattern BNL2 in the thickness direction. The second light-blocking member BK2 may block the transmission of light. The second light-blocking member BK2 may prevent light from penetrating between the first to third light-emitting areas LA1, LA2, and LA3 to prevent the mixing of colors, thereby improving color reproduction (color gamut). The second light-blocking member BK2 may be disposed in the form of a grid that surrounds the first to third light-emitting areas LA1, LA2, and LA3 in a plan view.

The first color filter CF1 may be disposed on the third planarization layer 43 in the first light-emitting area LA1. The first color filter CF1 may be surrounded by the second light-blocking member BK2. The first color filter CF1 may overlap the first wavelength conversion part WLC1 in the thickness direction. The first color filter CF1 may selectively transmit light of a first color (e.g., red light), and may block or absorb light of a second color (e.g., green light) and light of a third color (e.g., blue light). For example, the first color filter CF1 may be a red color filter and may include a red colorant. The red colorant may include a red dye or a red pigment.

The second color filter CF2 may be disposed on the third planarization layer 43 in the second light-emitting area LA2. The second color filter CF2 may be surrounded by the second light-blocking member BK2. The second color filter CF2 may overlap the second wavelength conversion part WLC2 in the thickness direction. The second color filter CF2 may selectively transmit light of a second color (e.g., green light), and may block or absorb light of a first color (e.g., red light) and light of a third color (e.g., blue light). For example, the second color filter CF2 may be a green color filter and may include a green colorant. The green colorant may include a green dye or a green pigment.

The third color filter CF3 may be disposed on the third planarization layer 43 in the third light-emitting area LA3. The third color filter CF3 may be surrounded by the second light-blocking member BK2. The third color filter CF3 may overlap the light-transmitting part LTU in the thickness direction. The third color filter CF3 may selectively transmit light of a third color (e.g., blue light), and may block or absorb light of a first color (e.g., red light) and light of a second color (e.g., green light). For example, the third color filter CF3 may be a blue color filter and may include a blue colorant. The blue colorant may include a blue dye or a blue pigment.

The first to third color filters CF1, CF2, and CF3 may absorb a portion of light entering from the outside of the display device 10 to reduce reflected light due to external light. Thus, the first to third color filters CF1, CF2, and CF3 may prevent color distortion due to external light reflection.

The first to third color filters CF1, CF2, and CF3 may be disposed directly on the third planarization layer 43 of the wavelength conversion layer WLCL. Thus, the display device 10 may not require a separate substrate for the first to third color filters CF1, CF2, and CF3. Accordingly, the thickness of the display device 10 may be relatively reduced.

The protective layer PRT may cover the first to third color filters CF1, CF2, and CF3. The protective layer PRT may protect the first to third color filters CF1, CF2, and CF3.

The encapsulation layer TFE may be disposed on the protective layer PRT of the color filter layer CFL. The encapsulation layer TFE may cover upper and side surfaces of a display layer. For example, the encapsulation layer TFE may include at least one inorganic film to prevent the permeation of oxygen or moisture. The encapsulation layer TFE may include at least one organic film to protect the display device 10 from foreign matter such as dust. For example, the encapsulation layer TFE may have a structure in which at least one organic film is stacked between two inorganic films. The inorganic films may each include silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, lithium fluoride, and the like. The organic film may include an acrylic-based resin, a methacrylic-based resin, polyisoprene, a vinyl-based resin, an epoxy-based resin, a urethane-based resin, a cellulose-based resin, a perylene-based resin, and the like. However, the structure of the encapsulation layer TFE is not limited to the above example, and the stacked structure may be changed in various ways.

Hereinafter, the transistor layer TFTL and the light-emitting element layer EML will be described in detail using planar and cross-sectional illustrations of a pixel of the display device according to an embodiment.

Figure 3:
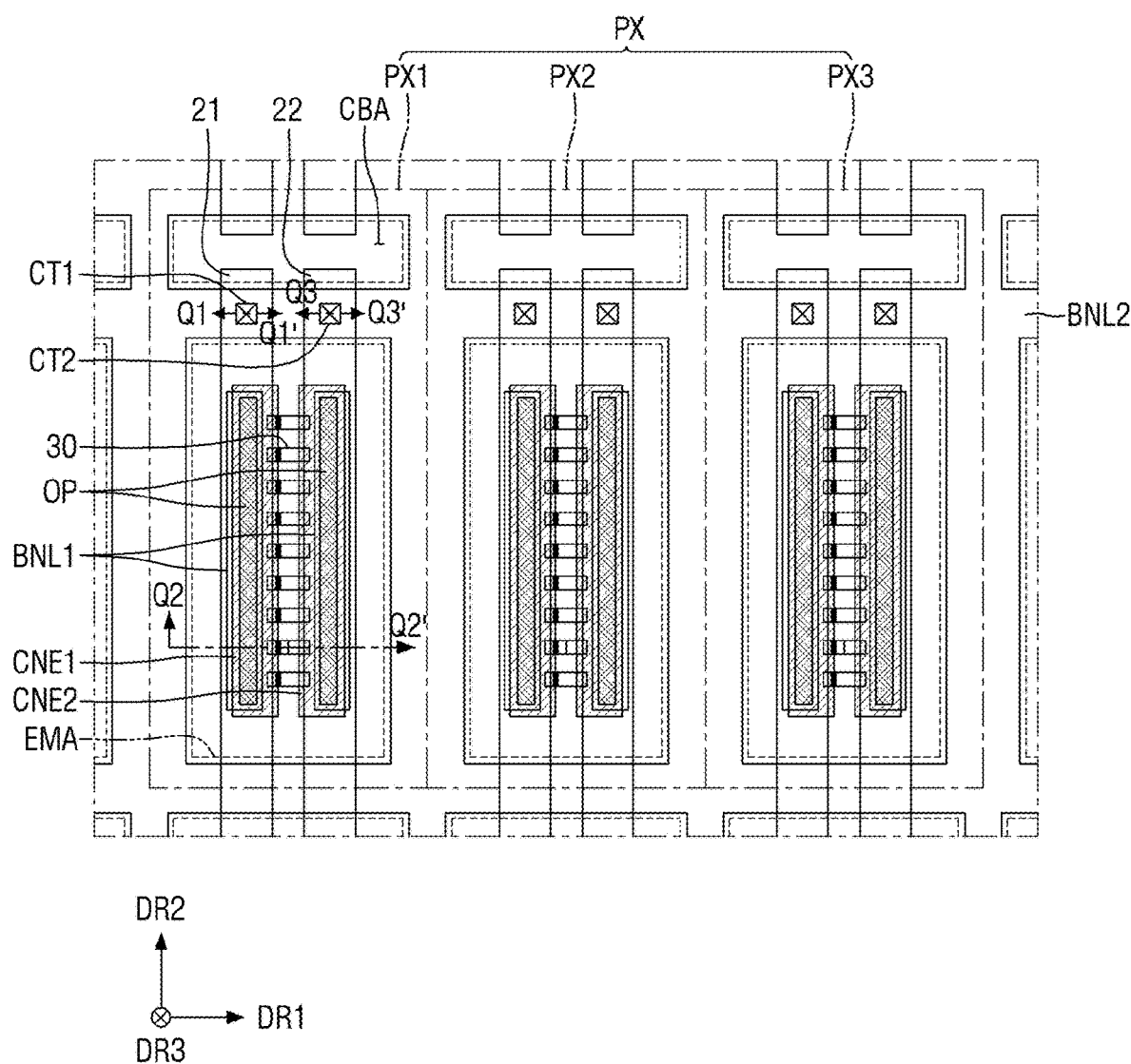
FIG. 3 is a schematic plan view illustrating a pixel of the display device according to an embodiment.

FIG. 3 is a plan view illustrating a pixel of the display device according to an embodiment.

Referring to FIG. 3, each of the pixels PX may include subpixels PXn (where n is an integer from one to three). For example, a pixel PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. As an example, the first color may be a blue color, the second color may be a green color, and the third color may be a red color. However, the disclosure is not limited thereto, and the subpixels PXn may emit light having the same color. In FIG. 3, the pixel PX is illustrated as including three subpixels PXn, but is not limited thereto, and may include a larger number of subpixels PXn.

Each of the subpixels PXn of the display device 10 may include a light-emitting part EMA and a non-light-emitting area (not shown). The light-emitting part EMA may be a part in which light-emitting elements 30 are disposed so that light having a specific wavelength band is emitted, and the non-light-emitting area may be an area in which the light-emitting elements 30 are not disposed and light emitted from the light-emitting elements 30 does not reach so that light is not emitted. The light-emitting part EMA may include an area in which the light-emitting element 30 is disposed, and may include an area which is adjacent to the light-emitting element 30 and through which light emitted from the light-emitting element 30 is emitted.

The disclosure is not limited thereto, and the light-emitting part EMA may also include an area in which the light emitted from the light-emitting element 30 is reflected or refracted due to another member to be emitted. Light-emitting elements 30 may be disposed in each of the subpixels PXn, and an area in which the light-emitting elements 30 are disposed and an area adjacent to the area may form an emission area.

Also, each subpixel PXn may include a cut-out part CBA disposed in the non-light-emitting area. The cut-out part CBA may be disposed at a side of the light-emitting part EMA in the second direction DR2. The cut-out part CBA may be disposed between the light-emitting parts EMA of the adjacent subpixels PXn in the second direction DR2. Light-emitting parts EMA and cut-out parts CBA may be arranged in the display area DPA of the display device 10. For example, each of the light-emitting parts EMA and the cut-out parts CBA may be repeatedly arranged in the first direction DR1, and the light-emitting parts EMA and the cut-out parts CBA may be alternately arranged in the second direction DR2. A separation distance between the cut-out parts CBA in the first direction DR1 may be less than a separation distance between the light-emitting parts EMA in the first direction DR1. The second pattern BNL2 may be disposed between the cut-out parts CBA and the light-emitting parts EMA, and a distance therebetween may vary according to a width of the second pattern BNL2. Since the light-emitting element 30 is not disposed in the cut-out part CBA, light is not emitted through the cut-out part CBA, but some of electrodes 21 and 22 disposed in each subpixel PXn may be disposed in the cut-out part CBA. The electrodes 21 and 22 disposed in each subpixel PXn may be disposed to be separated from each other in the cut-out part CBA.

Figure 4:
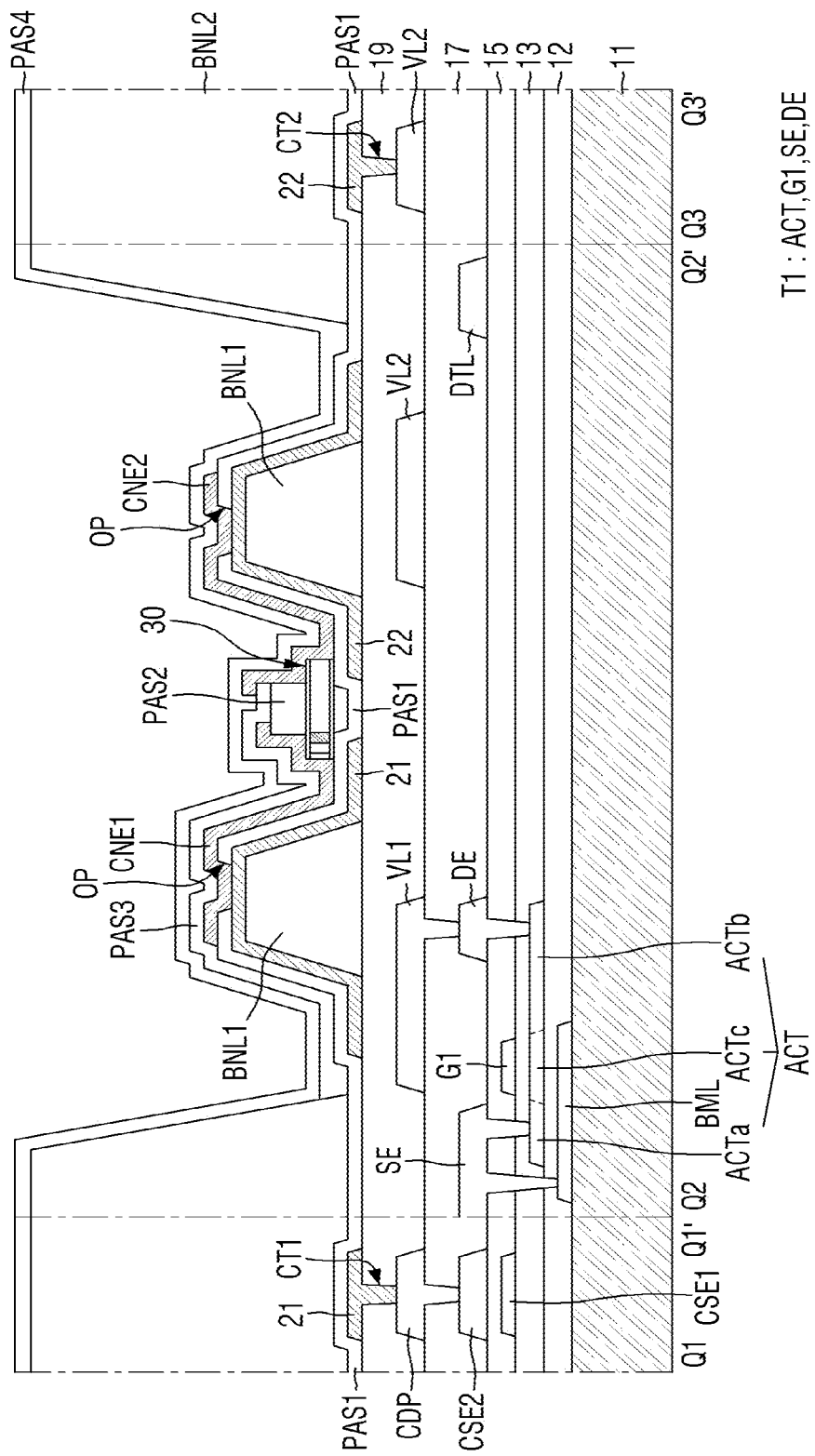
FIG. 4 is a schematic cross-sectional view taken along lines Q1-Q1', Q2-Q2', and Q3-Q3' of FIG. 3.

FIG. 4 is a cross-sectional view taken along lines Q1-Q1', Q2-Q2', and Q3-Q3' of FIG. 3. FIG. 4 illustrates a cross section traversing both end portions of the light-emitting element 30 disposed in the first subpixel PX1 of FIG. 3.

Referring to FIG. 4 together with FIG. 3, the display device 10 may include a substrate 11, and a semiconductor layer, conductive layers, and insulating layers, which are disposed on the substrate 11. The semiconductor layer, the conductive layers, and the insulating layers may form a circuit layer and a light-emitting element layer of the display device 10.

A light-blocking layer BML, may be disposed on the substrate 11. The light-blocking layer BML may be disposed to overlap an active layer ACT of a first transistor T1 of the display device 10. The light-blocking layer BML may include a material that blocks light, thereby preventing light from being incident on the active layer ACT of the first transistor T1. For example, the light-blocking layer BML may be made of an opaque metal material that blocks light from being transmitted. However, the disclosure is not limited thereto, and in some cases, the light-blocking layer BML may be omitted. The light-blocking layer BML may be electrically connected to the source electrode SE to suppress a change in voltage of a transistor. The light-blocking layer BML may be used as a line, for example, a power line, a data line, or a gate line.

A buffer layer 12 may be entirely disposed on the substrate 11, including the light-blocking layer BML. The buffer layer 12 may be formed on the substrate 11 to protect the first transistor T1 of the pixel PX from moisture permeating through the substrate 11 that is vulnerable to moisture permeation and may perform a surface planarization function. The buffer layer 12 may be formed of inorganic layers that are alternately stacked. For example, the buffer layer 12 may include a multi-layer formed by alternately stacking inorganic layers that include at least one of silicon oxide ($SiO_x$), silicon nitride ($SiN_x$), and silicon oxynitride ($SiO_xN_y$).

The semiconductor layer may be disposed on the buffer layer 12. The semiconductor layer may include the active layer ACT of the first transistor T1. The semiconductor layer and the active layer ACT may be disposed to partially overlap a gate electrode G1 or the like of a first gate conductive layer, which will be described below.

In the drawing, only the first transistor T1 included in the subpixel PXn of the display device 10 is illustrated, but the disclosure is not limited thereto. The display device 10 may include a larger number of transistors. For example, the display device 10 may further include one or more transistors in addition to the first transistor T1 and thus may include two or three transistors for each subpixel PXn.

The semiconductor layer may include polycrystalline silicon, single crystal silicon, an oxide semiconductor, or the like. In case that the semiconductor layer includes an oxide semiconductor, each active layer ACT may include conductive areas ACTa and ACTb and a channel area ACTc interposed therebetween. The oxide semiconductor may be an oxide semiconductor including indium (In). For example, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc oxide (IGZO), indium-gallium-zinc-tin oxide (IGZTO), or the like.

In another embodiment, the semiconductor layer may include polycrystalline silicon. The polycrystalline silicon may be formed by crystallizing amorphous silicon, and the conductive areas of the active layer ACT may be doped areas that are doped with impurities.

A gate insulating layer 13 may be disposed on the semiconductor layer and the buffer layer 12. The gate insulating layer 13 may be disposed on the buffer layer 12, including the semiconductor layer. The gate insulating layer 13 may serve as a gate insulating film of each transistor. The gate insulating layer 13 may be formed of an inorganic layer including an inorganic material such as silicon oxide ($SiO_x$), silicon nitride ($SiN_x$), and silicon oxynitride ($SiO_xN_y$), or may be formed in a stacked structure thereof.

The first gate conductive layer may be disposed on the gate insulating layer 13. The first gate conductive layer may include the gate electrode G1 of the first transistor T1 and a first capacitor electrode CSE1 of a storage capacitor. The gate electrode G1 may be disposed to overlap the channel area ACTc of the active layer ACT in the thickness direction. The first capacitor electrode CSE1 may be disposed to overlap a second capacitor electrode CSE2 to be described below in the thickness direction. In an embodiment, the first capacitor electrode CSE1 may be connected to and integrated with the gate electrode G1. The first capacitor electrode CSE1 may be disposed to overlap the second capacitor electrode CSE2 in the thickness direction, and the storage capacitor may be formed therebetween.

The first gate conductive layer may be formed of a single layer or a multi-layer that is made of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

A first interlayer insulating layer 15 may be disposed on the first gate conductive layer. The first interlayer insulating layer 15 may serve as an insulating film between the first gate conductive layer and other layers disposed thereon. The first interlayer insulating layer 15 may be disposed to cover the first gate conductive layer and to perform a function of protecting the first gate conductive layer. The first interlayer insulating layer 15 may be formed of an inorganic layer including an inorganic material such as silicon oxide ($SiO_x$), silicon nitride ($SiN_x$), and silicon oxynitride ($SiO_xN_y$), or may be formed in a stacked structure thereof.

A first data conductive layer may be disposed on the first interlayer insulating layer 15. The first data conductive layer may include a first source electrode SE and a first drain electrode DE of the first transistor T1, a data line DTL, and the second capacitor electrode CSE2.

The first source electrode SE and the first drain electrode DE of the first transistor T1 may contact the conductive areas ACTa and ACTb of the active layer ACT, respectively, through contact holes passing through the first interlayer insulating layer 15 and the gate insulating layer 13. The first source electrode SE of the first transistor T1 may be electrically connected to the light-blocking layer BML through another contact hole.

A data signal may be applied to another transistor (not shown) included in the display device 10 through the data line DTL. Although not shown in the drawing, the data line DTL may be connected to source and drain electrodes of another transistor so that a signal applied from the data line DTL may be transmitted thereto.

The second capacitor electrode CSE2 may be disposed to overlap the first capacitor electrode CSE1 in the thickness direction. In an embodiment, the second capacitor electrode CSE2 may be integrated with and connected to the first source electrode SE.

The first data conductive layer may be formed of a single layer or a multi-layer that is made of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

A second interlayer insulating layer 17 may be disposed on the first data conductive layer. The second interlayer insulating layer 17 may serve as an insulating film between the first data conductive layer and other layers disposed thereon. The second interlayer insulating layer 17 may cover the first data conductive layer to perform a function of protecting the first data conductive layer. The second interlayer insulating layer 17 may be formed of an inorganic layer including an inorganic material such as silicon oxide ($SiO_x$), silicon nitride ($SiN_x$), and silicon oxynitride ($SiO_xN_y$) or may be formed in a stacked structure thereof.

A second data conductive layer may be disposed on the second interlayer insulating layer 17. The second data conductive layer may include a first voltage line VL1, a second voltage line VL2, and a first conductive pattern CDP. A high potential voltage (or a first power voltage) to be supplied to the first transistor T1 may be applied to the first voltage line VL1, and a low potential voltage (or a second power voltage) to be supplied to a second electrode 22 may be applied to the second voltage line VL2. During the manufacturing process of the display device 10, an alignment signal necessary to align the light-emitting elements 30 may be applied to the second voltage line VL2.

The first conductive pattern CDP may be connected to the second capacitor electrode CSE2 through a contact hole formed in the second interlayer insulating layer 17. The second capacitor electrode CSE2 may be integrated with the first source electrode SE of the first transistor T1, and the first conductive pattern CDP may be electrically connected to the first source electrode SE. The first conductive pattern CDP may also contact a first electrode 21 to be described below, and the first transistor T1 may transmit the first power voltage applied from the first voltage line VL1 to the first electrode 21 through the first conductive pattern CDP. In the drawing, the second data conductive layer is illustrated as including a second voltage line VL2 and a first voltage line VL1, but the disclosure is not limited thereto. The second data conductive layer may include a larger number of first voltage lines VL1 and a larger number of second voltage lines VL2. However, the disclosure is not limited thereto, and the first data conductive layer may also serve to transmit a signal such as a power supply voltage, and the second data conductive layer may be omitted.

The second data conductive layer may be formed of a single layer or a multi-layer that is made of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

A first planarization layer 19 may be disposed on the second data conductive layer. The first planarization layer 19 may include an organic insulating material, for example, an organic material such as polyimide (PI), and may perform a surface planarization function.

First patterns BNL1, the electrodes 21 and 22, the light-emitting element 30, connection electrodes CNE1 and CNE2, and the second pattern BNL2 may be disposed on the first planarization layer 19. Insulating layers PAS1, PAS2, PAS3, and PAS4 may be disposed on the first planarization layer 19.

The first patterns BNL1 may be disposed directly on the first planarization layer 19. Each of the first patterns BNL1 may have a shape extending in the second direction DR2 in each subpixel PXn but may not extend to another adjacent subpixel PXn in the second direction DR2, and may be disposed in the light-emitting part EMA. The first patterns BNL1 may be disposed to be spaced apart from each other in the first direction DR1, and the light-emitting element 30 may be disposed therebetween. The first patterns BNL1 may be disposed for each subpixel PXn to form linear patterns in the display area DPA of the display device 10. Two first patterns BNL1 are illustrated in the drawing, but the disclosure is not limited thereto. A larger number of first patterns BNL1 may be disposed depending on the number of electrodes 21 and 22.

The first pattern BNL1 may have a structure of which at least a portion protrudes from an upper surface of the first planarization layer 19. The protruding portion of the first pattern BNL1 may have inclined side surfaces, and light emitted from the light-emitting element 30 may be reflected from the electrodes 21 and 22 disposed on the first pattern BNL1 and may be emitted in an upward direction of the first planarization layer 19. The first pattern BNL1 may provide an area in which the light-emitting element 30 is disposed, and simultaneously, may serve as a reflective partition wall that reflects light emitted from the light-emitting element 30 upward. The side surface of the first pattern BNL1 may be inclined in a linear shape, but the disclosure is not limited thereto. The first pattern BNL1 may have an outer surface that has a curved semi-circular or semi-elliptical shape. The first patterns BNL1 may include an organic insulating material such as polyimide (PI), but the disclosure is not limited thereto.

The electrodes 21 and 22 may be disposed on the first patterns BNL1 and the first planarization layer 19. The electrodes 21 and 22 may include the first electrode 21 and the second electrode 22. The first electrode 21 and the second electrode 22 may extend in the second direction DR2 and may be disposed to be spaced apart from each other in the first direction DR1.

The first electrode 21 and the second electrode 22 may each extend in the second direction DR2 in the subpixel PXn, and may be separated from other electrodes 21 and 22 in the cut-out part CBA. For example, the cut-out part CBA may be disposed between the light-emitting parts EMA of the adjacent subpixels PXn in the second direction DR2, and the first electrode 21 and the second electrode 22 may be separated from another first electrode 21 and another second electrode 22, which are disposed in the adjacent subpixel PXn in the second direction DR2, in the cut-out part CBA. However, the disclosure is not limited thereto, and some electrodes 21 and 22 may not be separated for each subpixel PXn and may be disposed to extend beyond the adjacent subpixel PXn in the second direction DR2, or only one of the first electrode 21 and the second electrode 22 may be separated for each subpixel PXn.

The first electrode 21 may be electrically connected to the first transistor T1 through a first contact hole CT1, and the second electrode 22 may be electrically connected to the second voltage line VL2 through a second contact hole CT2. For example, the first electrode 21 may contact the first conductive pattern CDP through the first contact hole CT1 passing through the first planarization layer 19 at a portion of the second pattern BNL2, which extends in the first direction DR1. Also, the second electrode 22 may contact the second voltage line VL2 through the second contact hole CT2 passing through the first planarization layer 19 at a portion of the second pattern BNL2, which extends in the first direction DR1. However, the disclosure is not limited thereto. In another embodiment, the first contact hole CT1 and the second contact hole CT2 may be disposed in the light-emitting part EMA surrounded by the second pattern BNL2 so as not to overlap the second pattern BNL2. In another embodiment, the second electrode 22 may directly contact the first data conductive layer, and thus a voltage may be applied to the second electrode 22.

In the drawing, it is illustrated that one first electrode 21 and one second electrode 22 are disposed for each subpixel PXn, but the disclosure is not limited thereto, and a larger number of first electrodes 21 and second electrodes 22 may be disposed for each subpixel PXn. The first electrode 21 and the second electrode 22 disposed in each subpixel PXn may not necessarily have a shape extending in one direction, and the first electrode 21 and the second electrode 22 may be disposed in various structures. For example, the first electrode 21 and the second electrode 22 may each have a partially curved or bent shape, and one electrode of the first electrode 21 and the second electrode 22 may be disposed to surround the other electrode thereof.

Each of the first electrode 21 and the second electrode 22 may be disposed directly on the first patterns BNL1. Each of the first electrode 21 and the second electrode 22 may be formed to have a width greater than that of the first pattern BNL1. For example, each of the first electrode 21 and the second electrode 22 may be disposed to cover the outer surface of the first pattern BNL1. Each of the first electrode 21 and the second electrode 22 may be disposed on a side surface of the first pattern BNL1, and a distance between the first electrode 21 and the second electrode 22 may be less than a distance between the first patterns BNL1. At least a partial area of each of the first electrode 21 and the second electrode 22 may be disposed directly on the first planarization layer 19 to be coplanar with each other. However, the disclosure is not limited thereto. In some cases, the width of each of the electrodes 21 and 22 may be less than that of the first pattern BNL1. However, each of the electrodes 21 and 22 may be disposed to cover at least one side surface of the first pattern BNL1 to reflect light emitted from the light-emitting element 30.

Each of the electrodes 21 and 22 may include a conductive material having high reflectance. For example, as the conductive material having high reflectance, each of the electrodes 21 and 22 may include a metal such as silver (Ag), copper (Cu), or aluminum (Al) or may include an alloy including aluminum (Al), nickel (Ni), lanthanum (La), or the like. Each of the electrodes 21 and 22 may reflect light, which is emitted from the light-emitting element 30 and travels toward the side surface of the first pattern BNL1, in an upward direction of each subpixel PXn.

However, the disclosure is not limited thereto, and each of the electrodes 21 and 22 may further include a transparent conductive material. For example, each of the electrodes 21 and 22 may include materials such as indium tin oxide (ITO), indium zinc oxide (IZO), indium tin-zinc oxide (ITZO), or the like. In some embodiments, each of the electrodes 21 and 22 may be formed of a stack of one or more layers of a transparent conductive material and a metal layer having high reflectance, or may be formed as a single layer including the transparent conductive material and the metal layer. For example, each of the electrodes 21 and 22 may have a stacked structure such as ITO/silver (Ag)/ITO/, ITO/Ag/IZO, or ITO/Ag/ITZO/IZO.

The electrodes 21 and 22 may be electrically connected to the light-emitting elements 30 and may receive a predetermined voltage to allow the light-emitting elements 30 to emit light. The electrodes 21 and 22 may be electrically connected to the light-emitting elements 30 through the connection electrodes CNE1 and CNE2, and electrical signals applied to the electrodes 21 and 22 may be transmitted to the light-emitting elements 30 through the connection electrodes CNE1 and CNE2.

One of the first electrode 21 and the second electrode 22 may be electrically connected to an anode of the light-emitting element 30, and the other may be electrically connected to a cathode of the light-emitting element 30. However, the disclosure is not limited thereto and the reverse may be possible.

Further, each of the electrodes 21 and 22 may be utilized to form an electric field in the subpixel PXn, thereby aligning the light-emitting elements 30. The light-emitting elements 30 may be disposed between the first electrode 21 and the second electrode 22 due to the electric field formed on the first electrode 21 and the second electrode 22. The light-emitting elements 30 of the display device 10 may be sprayed onto the electrodes 21 and 22 through an inkjet printing process. When ink including the light-emitting elements 30 is sprayed onto the electrodes 21 and 22, an alignment signal is applied to the electrodes 21 and 22 to generate the electric field. The light-emitting elements 30 dispersed in the ink may be aligned on the electrodes 21 and 22 by receiving a dielectrophoretic force by the electric field generated on the electrodes 21 and 22.

A first insulating layer PAS1 may be disposed on the first planarization layer 19. The first insulating layer PAS1 may be disposed to cover the first patterns BNL1 and the first and second electrodes 21 and 22. The first insulating layer PAS1 may protect the first electrode 21 and the second electrode 22, and simultaneously, insulate the first electrode 21 from the second electrode 22. The light-emitting element 30 disposed on the first insulating layer PAS1 may be prevented from being damaged by direct contact with other members.

In an embodiment, the first insulating layer PAS1 may include openings OP that partially expose the first electrode 21 and the second electrode 22. Each of the openings OP may partially expose a portion of each of the electrodes 21 and 22, which are disposed on an upper surface of the first pattern BNL1. A portion of each of the connection electrodes CNE1 and CNE2 may contact each of the electrodes 21 and 22 exposed through the opening OP.

A step difference may be formed in the first insulating layer PAS1 so that a portion of an upper surface thereof is recessed between the first electrode 21 and the second electrode 22. For example, since the first insulating layer PAS1 is disposed to cover the first electrode 21 and the second electrode 22, the upper surface of the first insulating layer PAS1 may be stepped according to the shape of the electrodes 21 and 22 disposed below the first insulating layer PAS1. However, the disclosure is not limited thereto.

The second pattern BNL2 may be disposed on the first insulating layer PAS1. The second pattern BNL2 may be disposed in a grid pattern on an entire surface of the display area DPA, including portions extending in the first direction DR1 and the second direction DR2 in a plan view. The second pattern BNL2 may be disposed over boundaries of the subpixels PXn to distinguish the adjacent subpixels PXn.

Further, the second pattern BNL2 may be disposed to surround the light-emitting part EMA and the cut-out part CBA disposed for each subpixel PXn to distinguish the light-emitting part EMA and the cut-out part CBA. The first electrode 21 and the second electrode 22 may extend in the second direction DR2 and may be disposed to cross a portion of the second pattern BNL2 extending in the first direction DR1. In the portion of the second pattern BNL2 extending in the second direction DR2, a portion disposed between the light-emitting parts EMA may have a width greater than that of a portion disposed between the cut-out parts CBA. Thus, the distance between the cut-out parts CBA may be less than the distance between the light-emitting parts EMA.

The second pattern BNL2 may be formed to have a height greater than that of the first pattern BNL1. The second pattern BNL2 may prevent the ink from overflowing to adjacent subpixels PXn in an inkjet printing process of a manufacturing process of the display device 10, thereby separating the ink, in which other light-emitting elements 30 are dispersed for different subpixels PXn, so as not to be mixed. Like the first pattern BNL1, the second pattern BNL2 may include polyimide (PI), but the disclosure is not limited thereto.

The light-emitting elements 30 may be disposed on the first insulating layer PAS1. The light-emitting elements 30 are disposed to be spaced apart from each other in the second direction DR2 in which each of the electrodes 21 and 22 extends and may be aligned substantially parallel to each other. The light-emitting element 30 may have a shape extending in one direction, and the extending direction of the light-emitting element 30 may be substantially perpendicular to the direction in which each of the electrodes 21 and 22 extends. However, the disclosure is not limited thereto, and the light-emitting element 30 may be obliquely disposed without being perpendicular to the direction in which each of the electrodes 21 and 22 extends.

The light-emitting elements 30 disposed in each subpixel PXn may include light-emitting layers 36 (in FIG. 5) having different materials to emit light in different wavelength bands to the outside. Accordingly, light of a first color, light of a second color, and light of a third color may be emitted from the first subpixel PX1, the second subpixel PX2, and the third subpixel PX3, respectively. However, the disclosure is not limited thereto, and the subpixels PXn may include the same type of light-emitting elements 30 to emit light of substantially the same color.

Both end portions of the light-emitting element 30 may be respectively disposed on the electrodes 21 and 22 between the first patterns BNL1. An extended length of the light-emitting element 30 may be greater than the distance between the first electrode 21 and the second electrode 22, and both end portions of the light-emitting element 30 may be respectively disposed on the first electrode 21 and the second electrode 22. For example, the light-emitting element 30 may be disposed such that one end portion is placed on the first electrode 21 and the other end portion is placed on the second electrode 22.

The light-emitting element 30 may include layers disposed in a direction perpendicular to an upper surface of the substrate 11 or the first planarization layer 19. The light-emitting element 30 may be disposed such that one direction, in which the light-emitting element 30 extends, is parallel to the upper surface of the first planarization layer 19, and the semiconductor layers included in the light-emitting element 30 may be sequentially disposed in the direction parallel to the upper surface of the first planarization layer 19. However, the disclosure is not limited thereto, and in case that the light-emitting element 30 has a different structure, the semiconductor layers may be disposed in a direction perpendicular to the upper surface of the first planarization layer 19.

Both end portions of the light-emitting element 30 may contact the connection electrodes CNE1 and CNE2, respectively. For example, an insulating film 38 (in FIG. 5) may not be formed on an end surface of the light-emitting element 30 in one direction in which the light-emitting element 30 extends, semiconductor layers 31 and 32 (in FIG. 5) or an electrode layer 37 (in FIG. 5) may be partially exposed, and the exposed semiconductor layers 31 and 32 (in FIG. 5) or the exposed electrode layer 37 (in FIG. 5) may contact the connection electrodes CNE1 and CNE2. However, the disclosure is not limited thereto, and at least a partial area of the insulating film 38 may be removed from the light-emitting element 30 so that side surfaces of both end portions of each of the semiconductor layers 31 and 32 (in FIG. 5) may be partially exposed. The exposed side surfaces of the semiconductor layers 31 and 32 (in FIG. 5) may also directly contact the connection electrodes CNE1 and CNE2.

A second insulating layer PAS2 may be partially disposed on the light-emitting element 30. For example, the second insulating layer PAS2 may be disposed on the light-emitting element 30 to have a width less than the length of the light-emitting element 30 to expose both end portions of the light-emitting element 30 while surrounding the light-emitting element 30. The second insulating layer PAS2 is disposed to cover the light-emitting element 30, the electrodes 21 and 22, and the first insulating layer PAS1 in a manufacturing process of the display device 10, and then may be removed to expose both end portions of the light-emitting element 30. The second insulating layer PAS2 is disposed to extend in the second direction DR2 on the first insulating layer PAS1 in a plan view, thereby forming a linear or island-shaped pattern in each subpixel PXn. The second insulating layer PAS2 may protect the light-emitting element 30 and simultaneously fix the light-emitting element 30 in a manufacturing process of the display device 10.

The connection electrodes CNE1 and CNE2 and a third insulating layer PAS3 may be disposed on the second insulating layer PAS2.

The connection electrodes CNE1 and CNE2 may have a shape extending in one direction and may be respectively disposed on the electrodes 21 and 22. The connection electrodes CNE1 and CNE2 may include a first connection electrode CNE1 disposed on the first electrode 21 and a second connection electrode CNE2 disposed on the second electrode 22. The connection electrodes CNE1 and CNE2 may be disposed to be spaced apart from each other and to face each other. For example, the first connection electrode CNE1 and the second connection electrode CNE2 may be disposed on the first electrode 21 and the second electrode 22, respectively, and spaced apart from each other in the first direction DR1. Each of the connection electrodes CNE1 and CNE2 may form a stripe pattern in the light-emitting part EMA of each subpixel PXn.

Each of the connection electrodes CNE1 and CNE2 may contact the light-emitting elements 30. The first connection electrode CNE1 may contact an end portion of each of the light-emitting elements 30, and the second connection electrode CNE2 may contact the other end portions. The semiconductor layer is exposed at both end surfaces of the light-emitting element 30 in the extending direction, and each of the connection electrodes CNE1 and CNE2 may contact the exposed semiconductor layer of the light-emitting element 30 to be electrically connected to the light-emitting element 30. One side of each of the connection electrodes CNE1 and CNE2 contacting both end portions of the light-emitting element 30 may be disposed on the second insulating layer PAS2. The first connection electrode CNE1 may contact the first electrode 21 through the opening OP, which exposes a portion of an upper surface of the first electrode 21, and the second connection electrode CNE2 may contact the second electrode 22 through the opening OP that exposes a portion of an upper surface of the second electrode 22.

A width of each of the connection electrodes CNE1 and CNE2 measured in one direction may be less than the width of each of the electrodes 21 and 22 measured in the one direction. The connection electrodes CNE1 and CNE2 may be disposed to contact one end portion and the other end portion of the light-emitting element 30, respectively, and simultaneously, to cover a portion of the upper surface of each of the first electrode 21 and the second electrode 22. However, the disclosure is not limited thereto, and the connection electrodes CNE1 and CNE2 may be formed to have a width greater than that of each of the electrodes 21 and 22 to cover both sides of each of the electrodes 21 and 22.

The connection electrodes CNE1 and CNE2 may include a transparent conductive material. For example, the connection electrodes CNE1 and CNE2 may include ITO, IZO, ITZO, aluminum (Al), or the like. Light emitted from the light-emitting element 30 may pass through the connection electrodes CNE1 and CNE2 and travel toward the electrodes 21 and 22. However, the disclosure is not limited thereto.

In the drawing, it is illustrated that two connection electrodes CNE1 and CNE2 are disposed in one subpixel PXn, but the disclosure is not limited thereto. The number of connection electrodes CNE1 and CNE2 may vary depending on the number of electrodes 21 and 22 disposed for each subpixel PXn.

The third insulating layer PAS3 may be disposed to cover the first connection electrode CNE1. The third insulating layer PAS3 may be disposed to cover a portion where the first connection electrode CNE1 is disposed, including the first connection electrode CNE1, based on position of the second insulating layer PAS2. For example, the third insulating layer PAS3 may be disposed to cover the first connection electrode CNE1 and the first insulating layer PAS1 that is disposed on the first electrode 21. Such an arrangement may be formed by a process of partially removing an insulating material layer, forming the third insulating layer PAS3, to form the second connection electrode CNE2, after the insulating material layer is disposed entirely on the light-emitting part EMA. In the above process, the insulating material layer forming the third insulating layer PAS3 may be removed together with an insulating material layer forming the second insulating layer PAS2, and one side of the third insulating layer PAS3 may be aligned with one side of the second insulating layer PAS2. One side of the second connection electrode CNE2 may be disposed on the third insulating layer PAS3, and the second connection electrode CNE2 may be insulated from the first connection electrode CNE1 with the third insulating layer PAS3 therebetween.

A fourth insulating layer PAS4 may be disposed entirely in the display area DPA of the substrate 11. The fourth insulating layer PAS4 may serve to protect members disposed on the substrate 11 from an external environment. In other embodiments, the fourth insulating layer PAS4 may be omitted.

Each of the first insulating layer PAS1, the second insulating layer PAS2, the third insulating layer PAS3, and the fourth insulating layer PAS4, which are described above, may include an inorganic insulating material or an organic insulating material. For example, the first insulating layer PAS1, the second insulating layer PAS2, the third insulating layer PAS3, and the fourth insulating layer PAS4 may each include an inorganic insulating material such as silicon oxide ($SiO_x$), silicon nitride ($SiN_x$), silicon oxynitride ($SiO_xN_y$), aluminum oxide ($Al_xO_y$), aluminum nitride (AlN), or the like. In other embodiments, the first insulating layer PAS1, the second insulating layer PAS2, the third insulating layer PAS3, and the fourth insulating layer PAS4 may each include an organic insulating material such as an acrylic resin, an epoxy resin, a phenolic resin, a polyamide resin, a PI resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the disclosure is not limited thereto.

Figure 5:
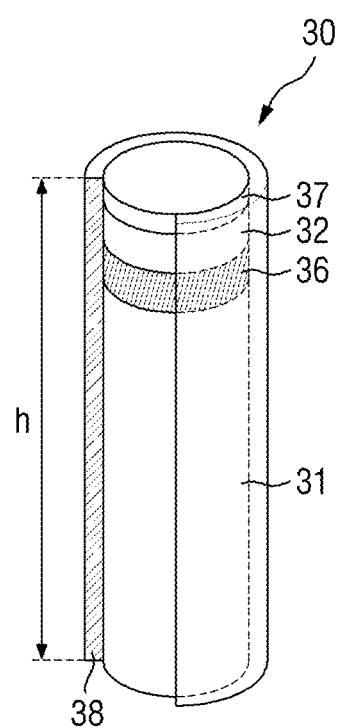
FIG. 5 is a schematic view of a light-emitting element according to an embodiment.

FIG. 5 is a schematic view of the light-emitting element according to an embodiment.

Referring to FIG. 5, the light-emitting element 30 may be a particulate element and may have a rod or cylindrical shape having a predetermined aspect ratio. The light-emitting element 30 may have a size ranging from a nanometer scale (about 1 nm or more and less than about 1 μm) to a micrometer scale (about 1 μm or more and less than about 1 mm). In an embodiment, both the diameter and length (or height; refer to h in FIG. 5) of the light-emitting element 30 may have a size of a nanometer scale or a size of a micrometer scale. In some other embodiments, the diameter of the light-emitting element 30 may have a size of a nanometer scale, and the length of the light-emitting element 30 may have a size of a micrometer scale. In some embodiments, the diameter and/or length of some of the light-emitting elements 30 may have a size of a nanometer scale, and the diameter and/or length of another some of the light-emitting elements 30 may have a size of a micrometer scale.

In an embodiment, the light-emitting element 30 may be an inorganic light-emitting diode. For example, the light-emitting element 30 may include a semiconductor layer doped with an arbitrary conductive-type (for example, p-type or n-type) impurity. The semiconductor layer may receive an electrical signal applied from an external power source and emit the received electrical signal as light in a wavelength band.

The light-emitting element 30 according to an embodiment may include a first semiconductor layer 31, a light-emitting layer 36, a second semiconductor layer 32, and the electrode layer 37 that are sequentially stacked in a length direction. The light-emitting element may further include the insulating film 38 that surrounds outer surfaces of the first semiconductor layer 31, the second semiconductor layer 32, and the light-emitting layer 36.

The first semiconductor layer 31 may be an n-type semiconductor. When the light-emitting element 30 emits light in a blue wavelength band, the first semiconductor layer 31 may include a semiconductor material having a chemical formula of $Al_xGa_yIn_{1-x-y}N$ ($0<=x<=1$, $0<=y<=1$, and $0<=x+y<=1$). For example, the semiconductor material may be one or more among AlGaInN, GaN, AlGaN, InGaN, AlN, and InN that are doped with an n-type impurity. The first semiconductor layer 31 may be doped with an n-type dopant, and the n-type dopant may be Si, Ge, Sn, or the like.

For example, the first semiconductor layer 31 may be n-GaN doped with Si that is an n-type dopant. The first semiconductor layer 31 may have a length ranging from about 1.5 μm to about 5 μm, but the disclosure is not limited thereto.

The second semiconductor layer 32 may be disposed on the light-emitting layer 36 to be described below. The second semiconductor layer 32 may be a p-type semiconductor, and in a case in which the light-emitting element 30 emits light in a blue or green wavelength band, the second semiconductor layer 32 may include a semiconductor material having a chemical formula of $Al_xGa_yIn_{1-x-y}N$ ($0<=x<=1$, $0<=y<=1$, and $0<=x+y<=1$). For example, the semiconductor material may be one or more among AlGaInN, GaN, AlGaN, InGaN, AlN, and InN that are doped with a p-type impurity. The second semiconductor layer 32 may be doped with a p-type dopant, and the p-type dopant may be Mg, Zn, Ca, Se, Ba, or the like. For example, the second semiconductor layer 32 may be p-GaN doped with Mg that is a p-type dopant. The second semiconductor layer 32 may have a length ranging from about 0.05 μm to about 0.10 μm, but the disclosure is not limited thereto.

In the drawing, the first semiconductor layer 31 and the second semiconductor layer 32 are illustrated as being formed as one layer, but the disclosure is not limited thereto. The first semiconductor layer 31 and the second semiconductor layer 32 may further include a larger number of layers, for example, a clad layer or a tensile strain barrier reducing (TSBR) layer according to the material of the light-emitting layer 36.

The light-emitting layer 36 may be disposed between the first semiconductor layer 31 and the second semiconductor layer 32. The light-emitting layer 36 may include a material having a single or multi-quantum well structure. When the light-emitting layer 36 includes a material having a multi-quantum well structure, the light-emitting layer 36 may have a structure in which quantum layers and well layers are alternately stacked. The light-emitting layer 36 may emit light due to a combination of electron-hole pairs in response to electrical signals applied through the first semiconductor layer 31 and the second semiconductor layer 32. When the light-emitting layer 36 emits light in a blue wavelength band, the light-emitting layer 36 may include a material such as AlGaN, AlGaInN, or the like. When the light-emitting layer 36 has a multiple quantum well structure in which quantum layers and well layers are alternately stacked, the quantum layer may include a material such as AlGaN or AlGaInN, and the well layer may include a material such as GaN or AlInN. For example, the light-emitting layer 36 may include AlGaInN as a quantum layer and AlInN as a well layer. As described above, the light-emitting layer 36 may emit blue light having a central wavelength band ranging from about 450 nm to about 495 nm.

However, the disclosure is not limited thereto, and the light-emitting layer 36 may have a structure in which semiconductor materials having large bandgap energy and semiconductor materials having small bandgap energy are alternately stacked or include other group III to V semiconductor materials according to the wavelength band of emitted light. The light emitted by the light-emitting layer 36 is not limited to light in the blue wavelength band, and the light-emitting layer 36 may also emit light in a red or green wavelength band in some cases. The light-emitting layer 36 may have a length ranging from about 0.05 μm to about 0.10 μm, but the disclosure is not limited thereto.

Meanwhile, the light emitted from the light-emitting layer 36 may be emitted to not only an outer surface of the light-emitting element 30 in a length direction but also both side surfaces of the light-emitting element 30. The directivity of the light emitted from the light-emitting layer 36 is not limited to one direction.

The electrode layer 37 may be an ohmic connection electrode. However, the disclosure is not limited thereto, and the electrode layer 37 may also be a Schottky connection electrode. The light-emitting element 30 may include at least one electrode layer 37. Although the light-emitting element 30 is illustrated in FIG. 5 as including one electrode layer 37, the disclosure is not limited thereto. In some cases, the light-emitting element 30 may include a larger number of electrode layers 37, or the electrode layer 37 may be omitted. The description of the light-emitting element 30, which will be made below, may be identically applied even when the number of electrode layers 37 is varied or another structure is further included.

In the display device 10 according to an embodiment, when the light-emitting element 30 is electrically connected to the electrode or the connection electrode, the electrode layer 37 may decrease the resistance between the light-emitting element 30 and the electrode or between the light-emitting element 30 and the connection electrode. The electrode layer 37 may include a conductive material. For example, the electrode layer 37 may include at least one among aluminum (Al), titanium (Ti), indium (In), gold (Au), silver (Ag), indium tin oxide (ITO), indium zinc oxide (IZO), and indium tin-zinc oxide (ITZO). Further, the electrode layer 37 may include a semiconductor material doped with an n-type or p-type impurity. The electrode layer 37 may include the same material or different materials, but the disclosure is not limited thereto.

The insulating film 38 may be disposed to surround outer surfaces of the semiconductor layers and the electrode layers, which are described above. For example, the insulating film 38 may be disposed to surround at least an outer surface of the light-emitting layer 36 and may extend in a direction in which the light-emitting element 30 extends. The insulating film 38 may serve to protect the above members. The insulating film 38 may be formed to surround side surface portions of the members and to expose both end portions of the light-emitting element 30 in the length direction.

In the drawing, the insulating film 38 is illustrated as being formed to extend in the length direction of the light-emitting element 30 to cover from the first semiconductor layer 31 to a side surface of the electrode layer 37, but the disclosure is not limited thereto. Since the insulating film 38 covers only the outer surfaces of some semiconductor layers, including the light-emitting layer 36 or covers only a portion of an outer surface of the electrode layer 37, the outer surface of the electrode layer 37 may be partially exposed. An upper surface of the insulating film 38 may be formed to be rounded in cross section in an area adjacent to at least one end portion of the light-emitting element 30.

The insulating film 38 may have a thickness ranging from about 10 nm to about 1.0 μm, but the disclosure is not limited thereto. For example, the insulating film 38 may have a thickness of about 40 nm.

The insulating film 38 may include an insulating material such as silicon oxide ($SiO_x$), silicon nitride ($SiN_x$), silicon oxynitride ($SiO_xN_y$), aluminum nitride (AlN), aluminum oxide ($Al_xO_y$), or the like. The insulating film 38 may be formed of a single film or a multilayer film made of the materials having insulating characteristics. Accordingly, it is possible to prevent an electrical short circuit which may occur when the light-emitting layer 36 is in direct contact with an electrode through which an electrical signal is transmitted to the light-emitting element 30. Further, since the insulating film 38 protects the outer surface of the light-emitting element 30, including the light-emitting layer 36, it is possible to prevent degradation in light emission efficiency.

An outer surface of the insulating film 38 may be surface-treated. The light-emitting elements 30 may be aligned by being sprayed onto electrodes in a state of being dispersed in predetermined ink. Here, to maintain a state in which the light-emitting elements 30 are dispersed in the ink without aggregating with other adjacent light-emitting elements 30, the surface of the insulating film 38 may be treated to be hydrophobic or hydrophilic. For example, the outer surface of the insulating film 38 may be surface-treated with a material such as stearic acid or 2,3-naphthalene dicarboxylic acid.

In the above-described display device 10, the light-emitting elements 30 may be sprayed onto the substrate 11 and aligned thereon in a state of being dispersed in predetermined light-emitting element ink. The substrate 11 on which the light-emitting element ink is sprayed may be dried after the alignment of the light-emitting element 30, which is performed while irradiating ultraviolet (UV) light, is completed. The light-emitting element ink may be applied to the light-emitting part EMA of the substrate 11 such that a thickness at a central portion is greater than a thickness at an outer periphery. When an alternating current (AC) voltage is applied to the electrodes 21 and 22 for the alignment of the light-emitting elements 30, an osmotic flow is generated in the light-emitting element ink due to the AC voltage. As the thickness of the light-emitting element ink is reduced, the velocity of the osmotic flow is increased, so that the light-emitting elements may be further pushed out to the outer periphery. Accordingly, the light-emitting elements 30 may be aggregated at the outer periphery of the light-emitting part EMA, thereby lowering the degree of alignment.

Hereinafter, an ink leveling device capable of improving the degree of alignment by leveling the thickness of the light-emitting element ink and aligning the light-emitting elements 30 uniformly will be described.

Figure 6:
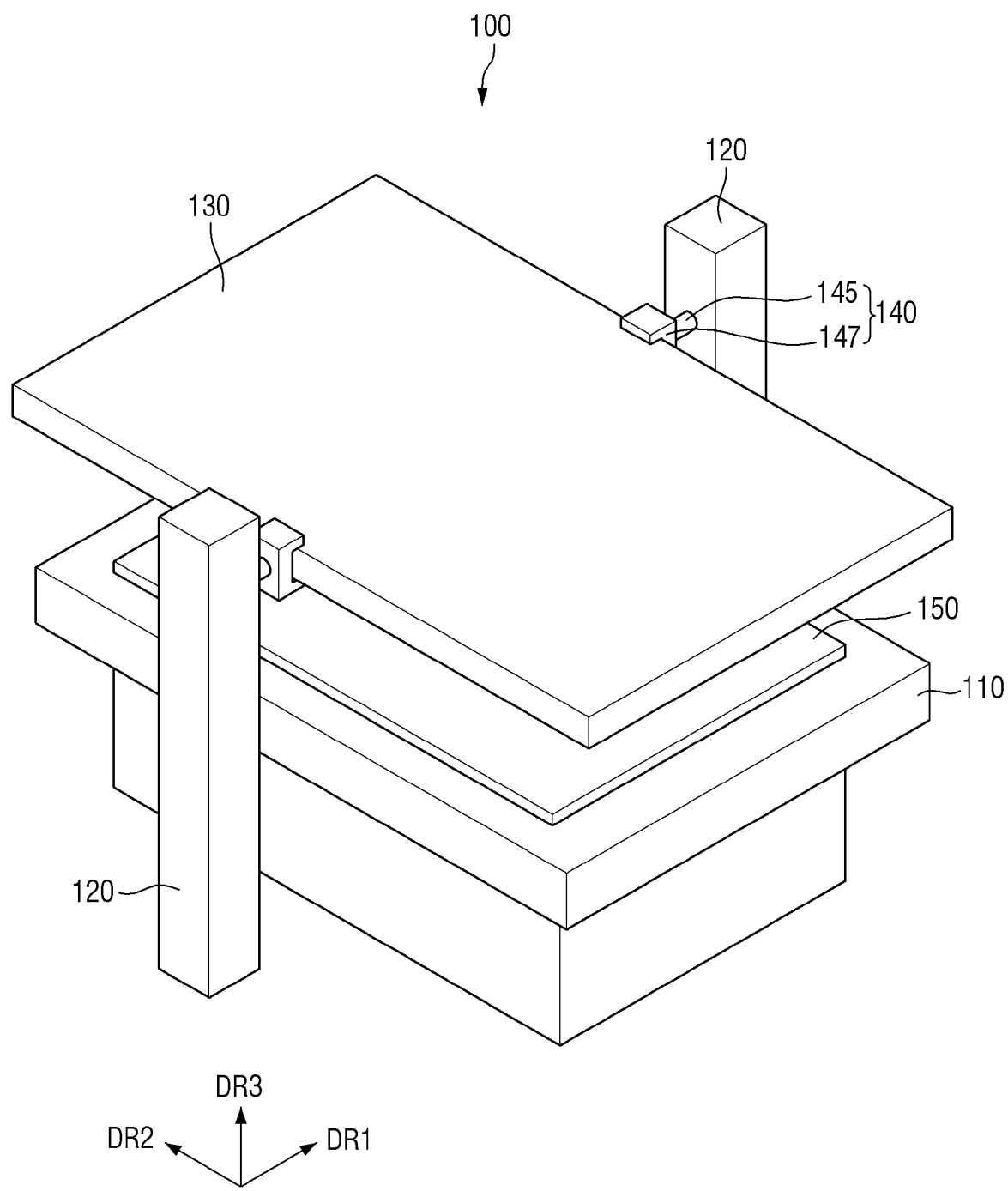
FIG. 6 is a schematic perspective view illustrating an ink leveling device according to an embodiment.
Figure 7:
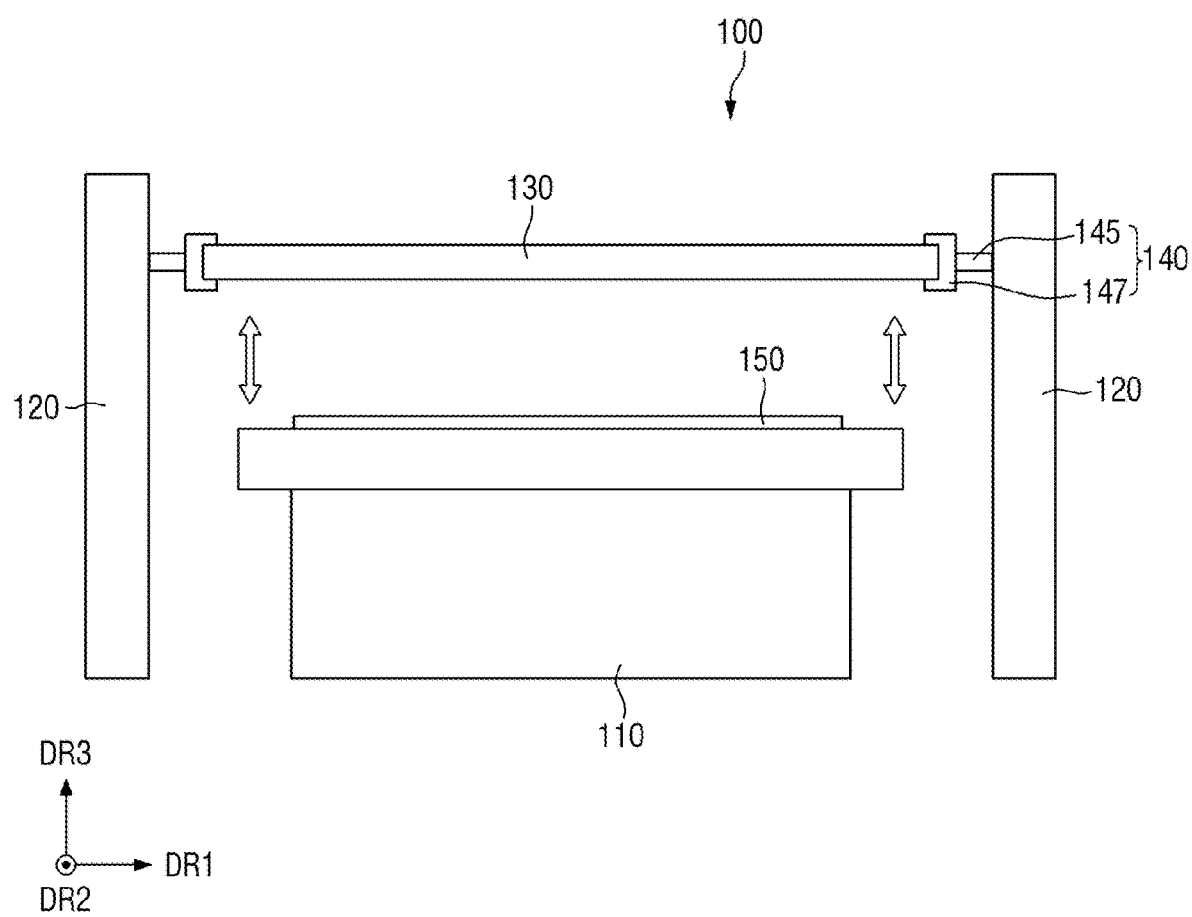
FIGS. 7 and 8 are schematic front views illustrating the ink leveling device according to an embodiment.
Figure 8:
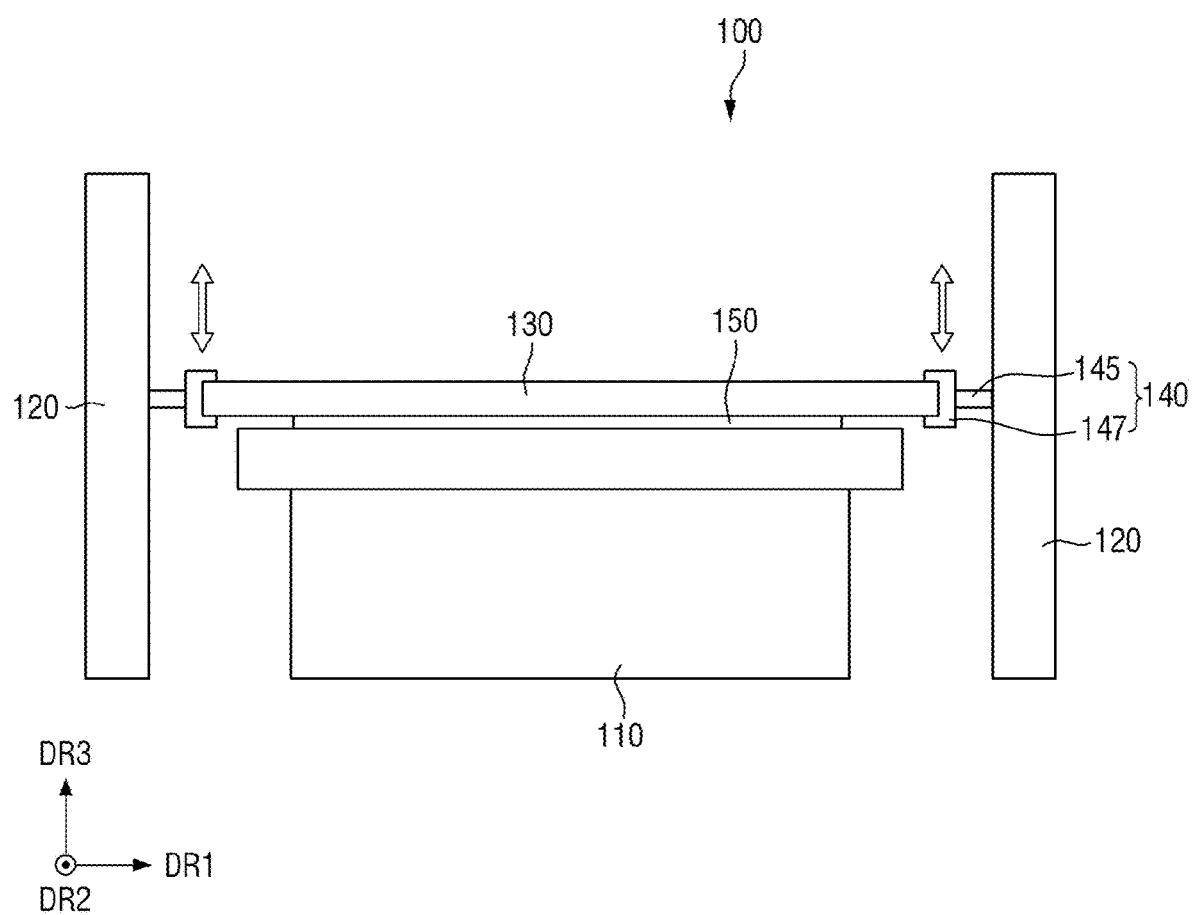

FIG. 6 is a perspective view illustrating an ink leveling device according to an embodiment. FIGS. 7 and 8 are front views illustrating the ink leveling device according to an embodiment.

Referring to FIGS. 6 to 8, an ink leveling device 100 according to an embodiment may include a stage 110, base frames 120, a plate 130, and moving members 140. The ink leveling device 100 may press a target substrate 150 onto which the predetermined light-emitting element ink is sprayed using the plate 130 to level the sprayed light-emitting element ink.

The stage 110 may provide an area in which the target substrate 150 is placed. The stage 110 may be provided with a flat plane table, such as a surface plate, where the target substrate 150 may be placed. In the drawing, the stage 110 is illustrated as having a fixed structure, but in some embodiments, the stage 110 may move along a rail.

The base frames 120 may be disposed on both sides of the stage 110 to be spaced apart from each other in a first direction DR1 and to extend in a third direction DR3. The moving members 140 configured to fix the plate 130 may be coupled to the base frames 120 to support them. The base frames 120 may have a structure fixed to both sides of the stage 110, but in some embodiments, each of the base frames 120 may move horizontally along a rail in a second direction DR2. The base frames 120 are each illustrated as being formed in a bar shape, but the disclosure is not limited thereto, and any shape that may be firmly supported from the floor, such as a ladder shape combining multiple bars is applicable.

Both sides of the plate 130 may be respectively fixed to the moving members 140 that are respectively coupled to both sides of the base frames 120. The plate 130 presses the target substrate 150 to level the ink sprayed onto the target substrate 150. The ink leveling device 100 may perform a process of spraying ink including light-emitting elements on the target substrate 150 and aligning the light-emitting elements while pressing the target substrate 150 with the plate 130. In the process of aligning the light-emitting elements, UV light may be continuously irradiated to the target substrate 150 to activate the dipole moment of the light-emitting element. The plate 130 may be made of a transparent material so that the UV light is irradiated to the target substrate 150 through the plate 130. The plate 130 may have a rigid property to press the target substrate 150. For example, the plate 130 may be made of polymethylmethacrylate (PMMA), polyacrylate (PA), polycarbonate (PC), polyethylene (PE), or the like. However, the disclosure is not limited thereto, and the plate 130 may be made from various materials as long as the materials are rigid and transparent.

The moving members 140 may each include a moving part 145 coupled to the base frame 120 and movable in a vertical direction, and a fixing part 147 disposed at an end of the moving part 145 to fix the plate 130. The moving part 145 may move upward and downward in a length direction of the base frame 120. The moving part 145 may move in the third direction DR3 along the base frame 120. The fixing part 147 may be fixed to the moving part 145 and move in the third direction DR3 according to the movement of the moving part 145. The fixing part 147 may fix the plate 130 so that the plate 130 may also move in the third direction DR3 according to the movement of the moving part 145.

In an embodiment, the base frames 120 may be provided on both sides of the stage 110, respectively, and each base frame 120 may include a moving member 140. One side and the other side of the plate 130 may be fixed to the fixing parts 147 of the base frames 120, respectively. The moving members 140 provided in the base frames 120 may be synchronized with each other and thus may move in the same way. For example, the fixing parts 147 may simultaneously move downward to be adjacent to the stage 110, or may simultaneously move upward to move away from the stage 110. Accordingly, the ink leveling device 100 may press the target substrate 150 placed on the stage 110 according to the upward and downward movement of the plate 130, thereby leveling the ink sprayed onto the target substrate 150.

Figure 9:
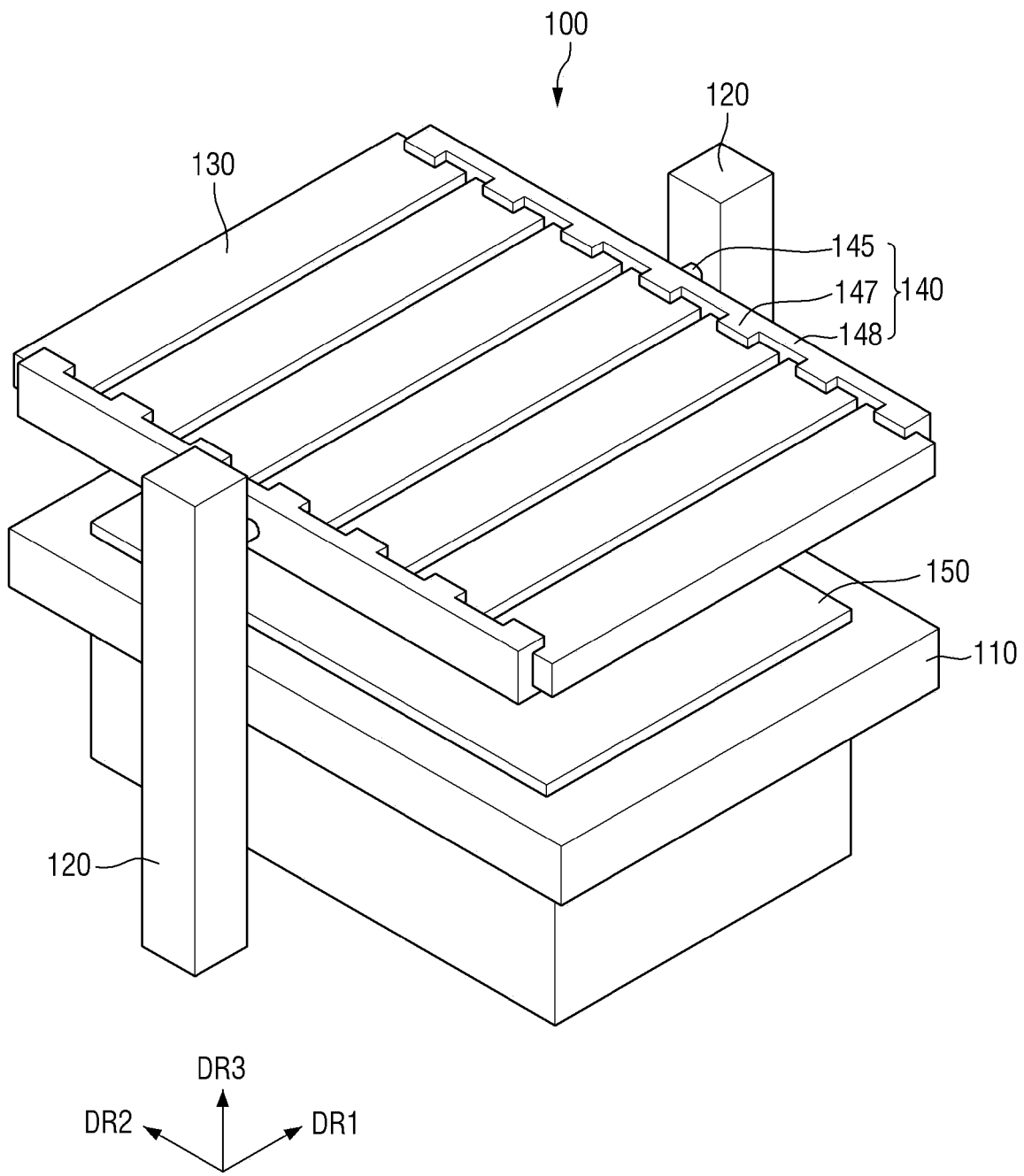
FIG. 9 is a schematic perspective view illustrating an ink leveling device according to another embodiment.

FIG. 9 is a perspective view illustrating an ink leveling device according to another embodiment.

Referring to FIG. 9, the embodiment is different from the embodiment described above with reference to FIGS. 6 to 8 in that an ink leveling device 100 includes fixing parts 147 and multiple plates 130. In the following, different components will be described in detail, and the descriptions of the same components will be omitted.

The ink leveling device 100 according to an embodiment may include moving members 140 provided in base frames 120. The moving members 140 may each include a moving part 145, a supporting part 148 coupled to the moving part 145, and fixing parts 147 each extending from the supporting part 148.

The supporting part 148 may serve to support the fixing parts 147 and may be coupled to the moving part 145. The supporting part 148 may extend in the second direction DR2, and the fixing parts 147 may each be disposed to protrude from the supporting part 148 in the first direction DR1. The fixing parts 147 may be disposed to be spaced apart from each other at regular intervals in the second direction DR2.

The ink leveling device 100 may include the plates 130. A single plate 130 is disposed in FIG. 6 described above, and multiple plates 130 may be disposed in the embodiment of FIG. 9. The plates 130 may uniformly press a target substrate 150 for each area, so that a uniform pressure may be applied to each area of the target substrate 150. The plates 130 may be fixed to both sides of the respective fixing part 147 and may be moved by the movement of the moving part 145. Each fixing part 147 may be coupled to a side of one of the plates 130 in a one-to-one manner.

The above-described ink leveling device 100 may level ink including light-emitting elements by pressing the target substrate 150 after the ink is sprayed onto the target substrate 150. Hereinafter, a method of manufacturing a display device using the ink leveling device 100 according to an embodiment will be described in detail.

Figure 10:
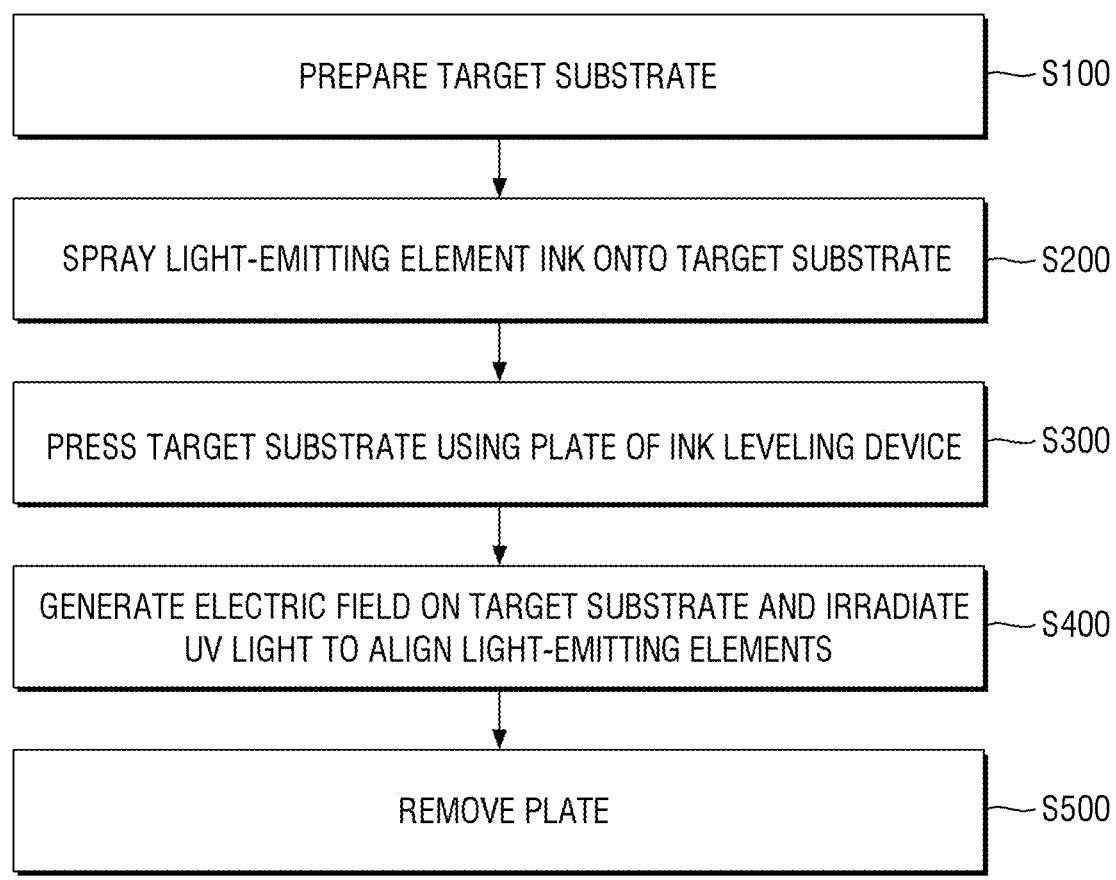
FIG. 10 is a flowchart illustrating a method of manufacturing a display device according to an embodiment.

FIG. 10 is a flowchart illustrating the method of manufacturing a display device according to an embodiment. FIGS. 11 to 18 are cross-sectional views illustrating the method of manufacturing a display device according to an embodiment.

Referring to FIG. 10, the method of manufacturing a display device according to an embodiment may include preparing a target substrate (S100), spraying light-emitting element ink onto the target substrate (S200), pressing the target substrate using a plate of an ink leveling device (S300), generating an electric field on the target substrate and irradiating UV light to align light-emitting elements (S400), and removing the plate (S500).

Figure 11:
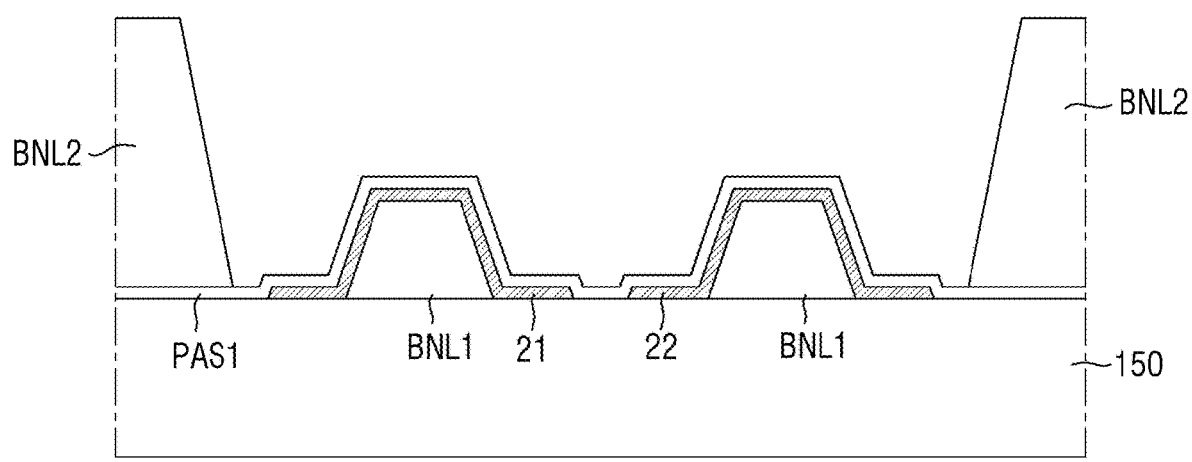
FIGS. 11 to 18 are schematic cross-sectional views illustrating the method of manufacturing a display device according to an embodiment.

Referring to FIG. 11 together with FIG. 10, a target substrate 150 is prepared (S100). A first electrode 21, a second electrode 22, a first insulating layer PAS1, a first pattern BNL1, and a second pattern BNL2 may be disposed on the target substrate 150. In the drawing, it is illustrated that a pair of electrodes are disposed on the target substrate 150, but a larger number of electrode pairs may be disposed on the target substrate 150. The target substrate 150 may include circuit elements disposed on the substrate 11 in addition to the substrate 11 of the display device 10, which is described above. Hereinafter, for convenience of description, the substrate 11 and the circuit elements will be omitted.

Figure 12:
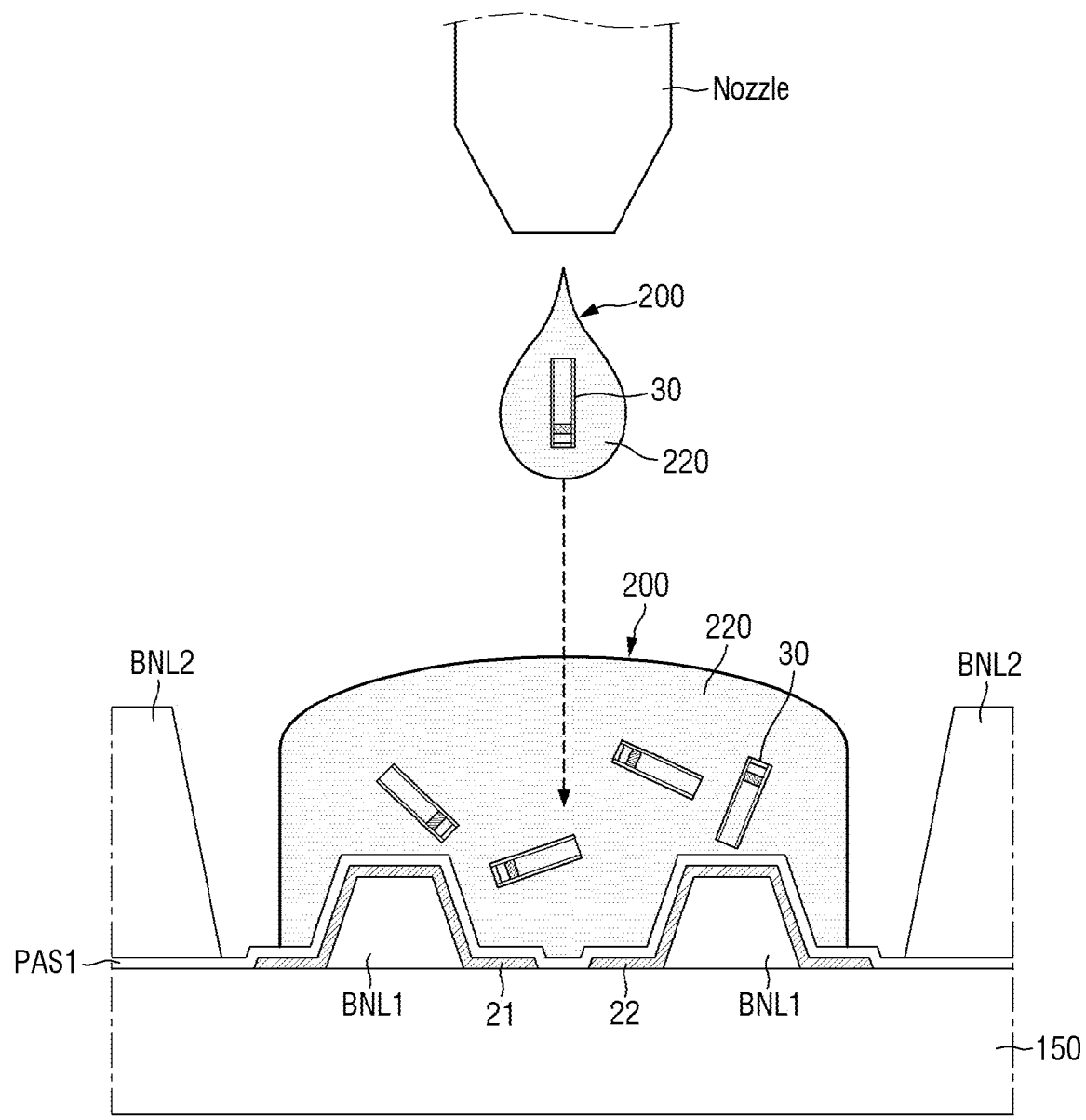

Referring to FIG. 12, a light-emitting element ink 200 is sprayed onto the target substrate 150 (S200). The light-emitting element ink 200 may include a solvent 220 and light-emitting elements 30 dispersed in the solvent 220. The light-emitting elements 30 may be uniformly dispersed in the solvent 220.

In an embodiment, the light-emitting element ink 200 may be sprayed onto the first insulating layer PAS1 through a printing process using an inkjet printing device. The light-emitting element ink 200 may be sprayed through a nozzle of an inkjet head included in the inkjet printing device. The light-emitting element ink 200 discharged from the nozzle may be seated on the first insulating layer PAS1, on which the electrodes 21 and 22 are formed, disposed on the target substrate 150. The light-emitting elements 30 may each have a shape extending in one direction, and may be dispersed in a state in which directions extending in the light-emitting element ink 200 have random orientation directions. In case that the light-emitting element ink 200 is sprayed onto the first insulating layer PAS1, the light-emitting element ink 200 may be applied inward the second pattern BNL2 without overflowing over the second pattern BNL2.

As shown in the drawing, the light-emitting element ink 200 may have a shape whose center portion is convex, and the thickness becomes smaller toward an outer periphery. In a subsequent process, when an AC voltage is applied to the electrodes 21 and 22 for the alignment of the light-emitting elements 30, an osmotic flow is generated in the ink due to the AC voltage. As the thickness of the ink is reduced, the velocity of the osmotic flow is increased, so that the light-emitting elements 30 may be further pushed out to the outer periphery. As a result, the light-emitting elements 30 may be aggregated at the outer periphery. When the light-emitting elements 30 are non-uniformly aligned, light emission may become non-uniform within one subpixel.

In an embodiment, an ink leveling device 100 may be used to make the thickness of the ink 200 uniform.

Figure 13:
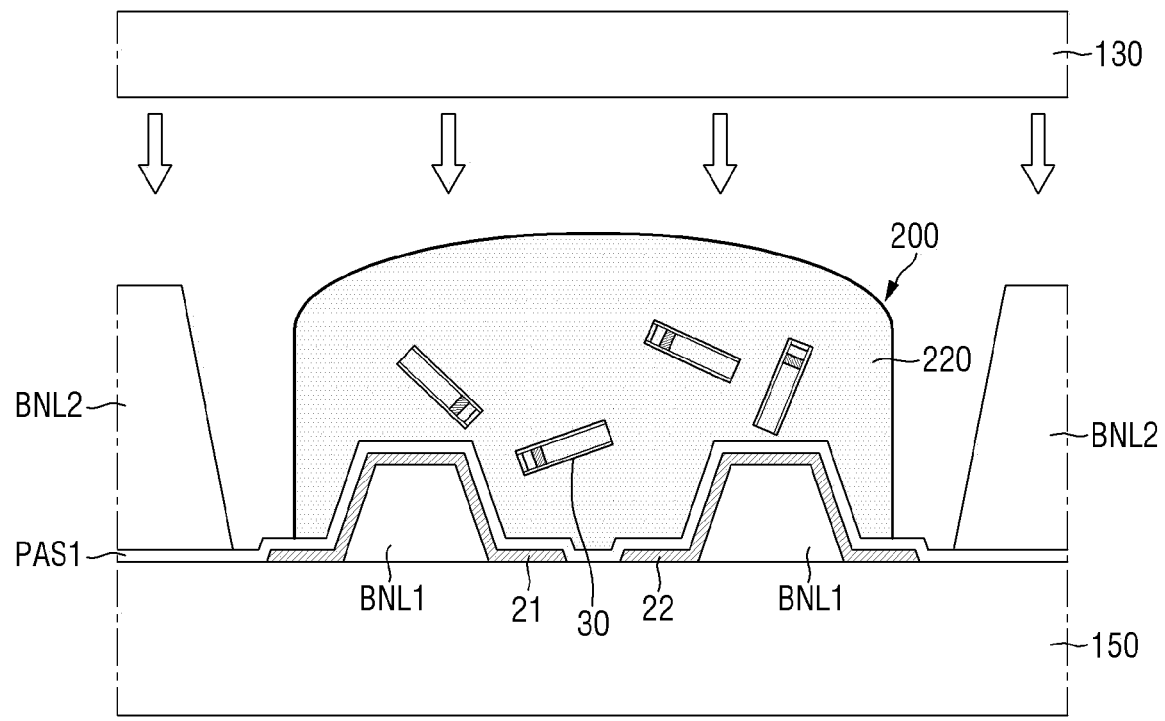
Figure 14:
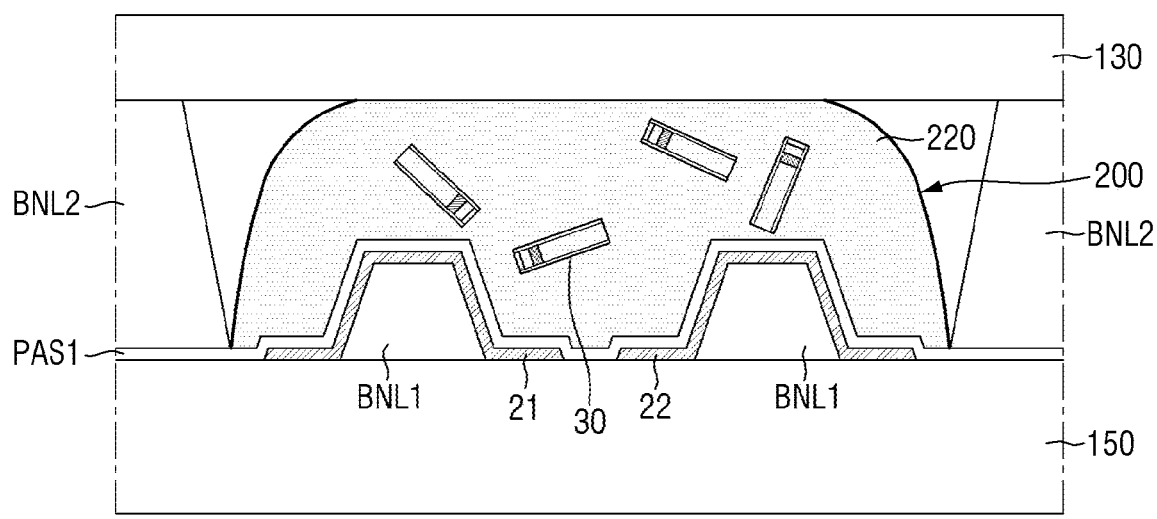
Figure 15:
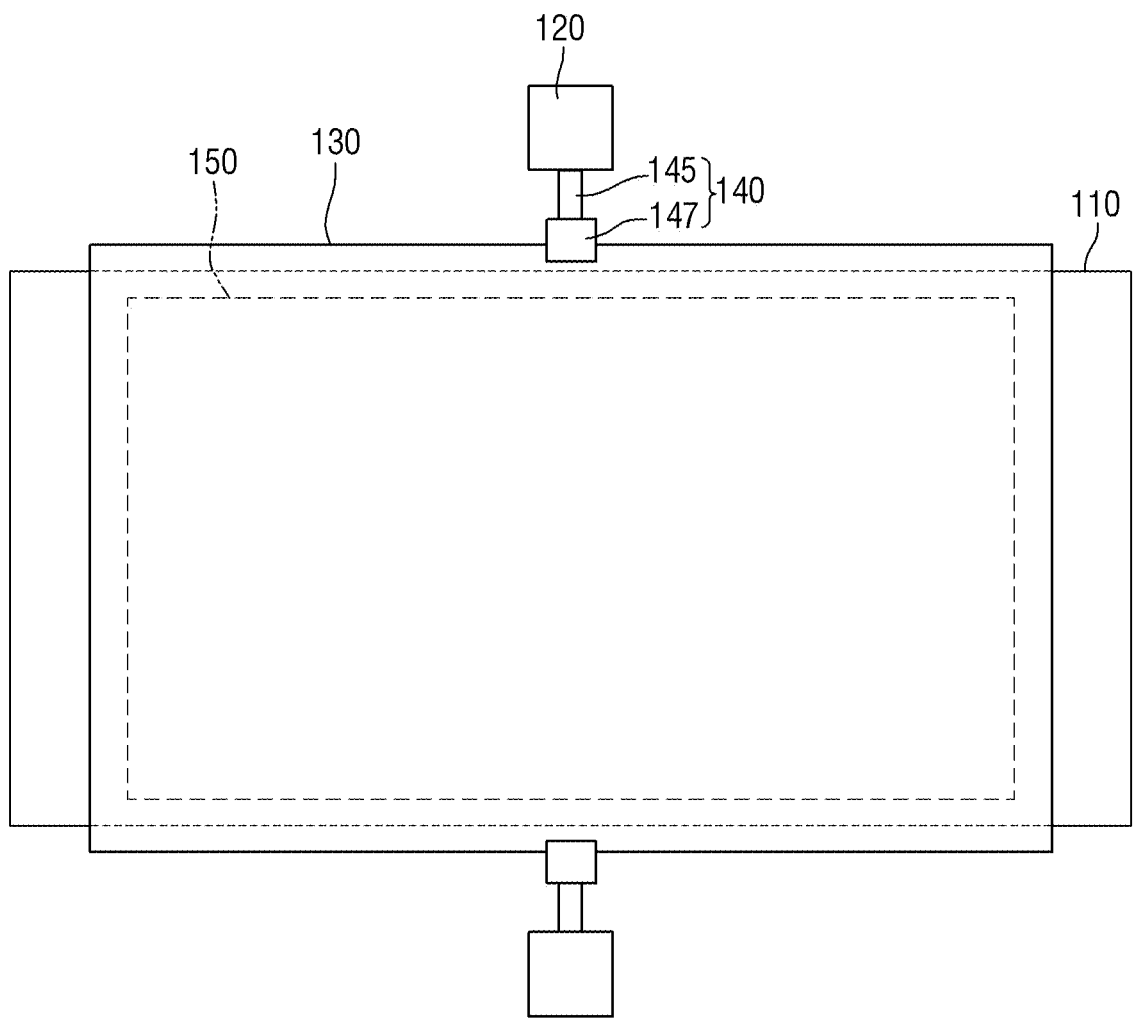

Referring to FIGS. 13 to 15 together with FIG. 6, the target substrate 150 is pressed using a plate 130 of the ink leveling device 100 (S300).

The ink leveling device 100 is aligned on the stage 110, and the plate 130 and the target substrate 150 are aligned. A moving part 145 of a moving member 140 is moved downward to bring the plate 130 fixed to a fixing part 147 into contact with the target substrate 150. The plate 130 may be brought into contact with an upper surface of the second pattern BNL2 disposed on the target substrate 150. The light-emitting element ink 200 sprayed onto the target substrate 150 may also contact the plate 130. The plate 130 may be formed to have a larger size than the target substrate 150 to completely cover the target substrate 150.

Subsequently, the moving part 145 of the ink leveling device 100 is further moved downward so that the plate 130 presses against the target substrate 150. When pressed by the plate 130 in contact with the upper surface of the second pattern BNL2, depending on the pressed distance, a height of the second pattern BNL2 may be reduced by the pressure from the plate 130. The plate 130 may not contact the first insulating layer PAS1 formed on the target substrate 150, thereby avoid damaging the components formed on the target substrate 150. In an embodiment, a distance between the first insulating layer PAS1 and the upper surface of the second pattern BNL2 may be formed in a range of about 0.4 to about 0.5 μm, and the distance to which the plate 130 presses may be in a range of about 0.1 to about 0.3 μm.

The plate 130 may contact the light-emitting element ink 200 and may press and spread the light-emitting element ink 200 between the second patterns BNL2. The plate 130 may block an upper portion between the second patterns BNL2 and may spread the light-emitting element ink 200 laterally while preventing the light-emitting element ink 200 from flowing over the second pattern BNL2.

In an embodiment, the light-emitting element ink 200 sprayed between the second patterns BNL2 may be pressed by the plate 130 based on the amount of the light-emitting element ink 200. As shown in Equation 1 below, the amount of the light-emitting element ink 200 may be obtained by multiplying the ink volume per drop times the number of drops, and dividing this result by a width of the subpixel times a thickness of the second pattern BNL2 after being pressed by the plate 130.

$$\frac{\text{ink volume per drop} \times \text{number of drops}}{\text{width of subpixel} \times \text{thickness of second pattern after being pressed by plate}} \quad \text{[Equation 1]}$$

The thickness of the second pattern BNL2 after being pressed by the plate is a value obtained by subtracting the distance at which the plate 130 presses from an initial height of the second pattern BNL2 from an upper surface of the first insulating layer PAS1.

As described above, by adjusting the amount of light-emitting element ink 200 sprayed onto a subpixel, when pressed by the plate 130, it is possible to prevent the light-emitting element ink 200 from overflowing to the adjacent subpixel over the second pattern BNL2 or internal component layers from being damaged due to the applied pressure.

Figure 16:
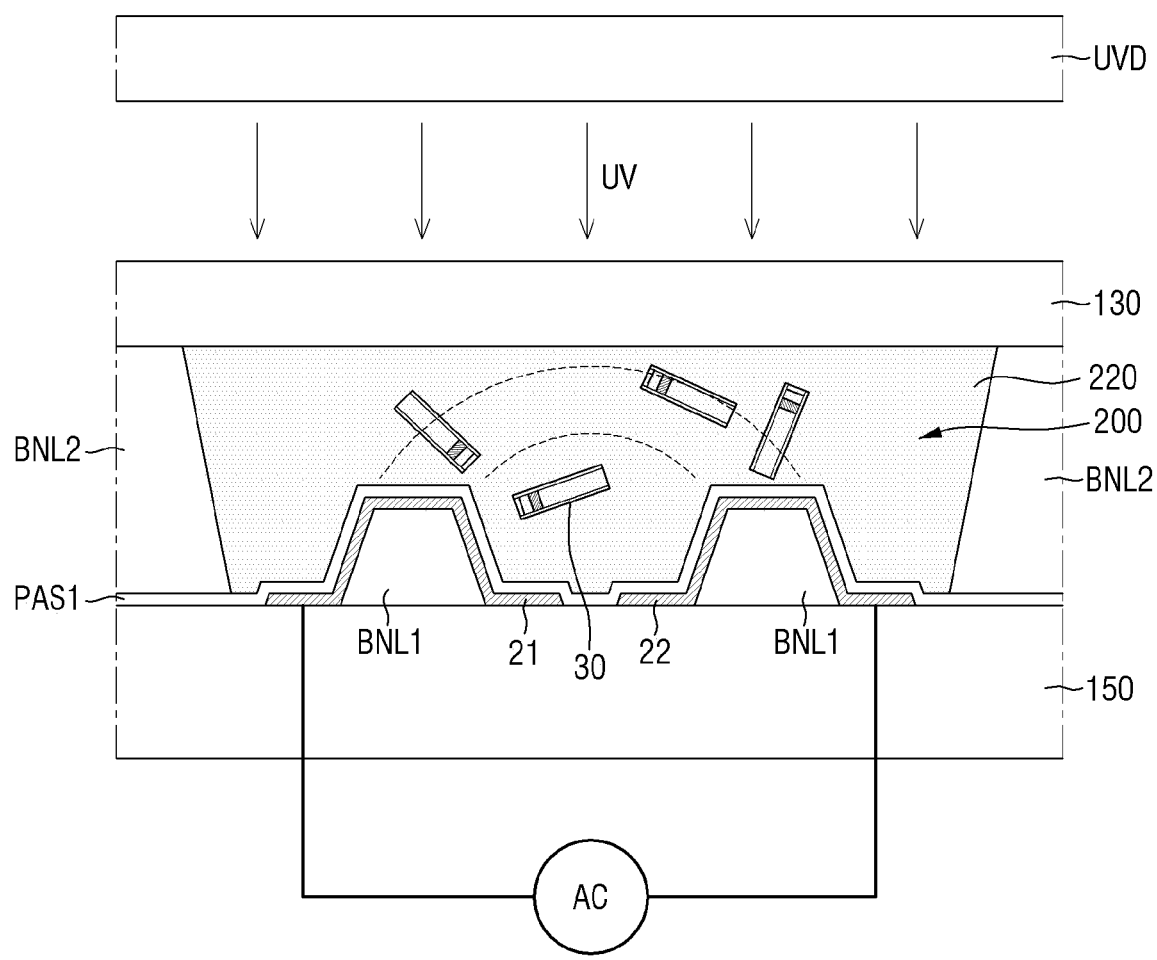

Referring to FIG. 16, through the pressing of the plate 130, the light-emitting element ink 200 may be leveled by being spread to a uniform thickness between the second patterns BNL2.

Subsequently, an electric field is generated on the target substrate 150 and UV light is irradiated to align the light-emitting elements 30 (S400). A UV irradiation device UVD is aligned on the target substrate 150 in which the pressure is maintained due to the plate 130, and the UV light is irradiated. The UV light may activate the dipole moment of the light-emitting element 30 to allow the light-emitting element 30 to be easily aligned by the generated electric field.

An alignment signal is applied to the electrodes 21 and 22 to generate an electric field EL on the target substrate 150. The light-emitting elements 30 dispersed in the light-emitting element solvent 220 may be subjected to a dielectrophoretic force caused by the electric field EL, and may be disposed on the electrodes 21 and 22 while orientation directions and positions of the light-emitting elements 30 are changed.

When the electric field EL is generated on the target substrate 150, the light-emitting elements 30 may receive the dielectrophoretic force. When the electric field EL generated on the target substrate 150 is generated in parallel with an upper surface of the target substrate 150, the light-emitting elements 30 may be arranged so that the direction in which the light-emitting elements 30 extend is parallel to the target substrate 150, and disposed on the first electrode 21 and the second electrode 22. The light-emitting elements 30 may each move from the initially dispersed position toward the electrodes 21 and 22 by the dielectrophoretic force. Both end portions of each of the light-emitting elements 30 may be disposed on the first electrode 21 and the second electrode 22 while changing the positions and orientation directions thereof by the electric field EL. Each of the light-emitting elements 30 may include semiconductor layers doped with different conductivity types and may have a dipole moment formed therein. When the light-emitting elements 30 having a dipole moment are placed on the electric field EL, the light-emitting elements 30 may be aligned by receiving a dielectrophoretic force so that both end portions thereof are disposed on the electrodes 21 and 22, respectively.

When an AC voltage is applied to the electrodes 21 and 22 for the alignment of the light-emitting elements 30, a flow is generated in the light-emitting element ink 200 due to the AC voltage. As the thickness of the light-emitting element ink 200 is reduced, a flow velocity is increased, so that the light-emitting elements may be further pushed out to the outer periphery. In an embodiment, leveling the light-emitting element ink 200 to have a uniform thickness may prevent formation of aggregations of light-emitting elements 30 that are pushed out to the outer periphery due to the flow from the AC voltage. Thus, the light-emitting elements 30 may be uniformly distributed and aligned.

Figure 17:
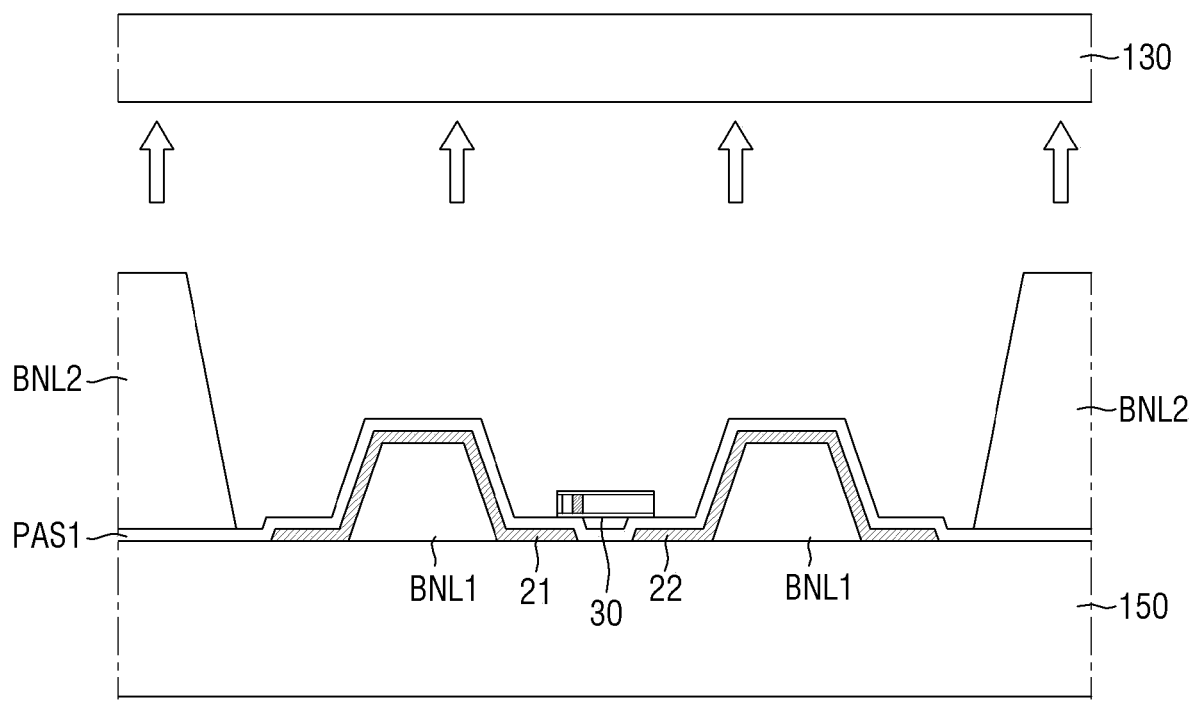

Referring to FIG. 17, the plate 130 is removed (S500). After the process of aligning the light-emitting elements 30 is completed, the plate 130 of the ink leveling device 100 is moved upward, and separated and removed from the target substrate 150. The UV irradiation device UVD may also be separated and removed.

Subsequently, the target substrate 150 is heat-treated to remove the light-emitting element solvent. The heat treatment process may be performed in a chamber capable of adjusting an internal pressure. The chamber may adjust the internal pressure in the device, and heat is irradiated onto the target substrate 150 while the pressure is adjusted, thereby removing the light-emitting element solvent. In the method of manufacturing the display device 10, the light-emitting element solvent may be completely removed by performing heat treatment in a low-pressure environment. According to an embodiment, the process of removing the light-emitting element solvent be performed in a temperature range of about 25° C. to about 150° C. at a pressure ranging from about $10^{-4}$ Torr to about 1 Torr. When the heat treatment process is performed within the pressure range, a boiling point of the light-emitting element solvent is also lowered, so that the solvent may be more easily removed. The heat treatment process performed in the chamber may be performed for 1 minute to 30 minutes. However, the disclosure is not limited thereto.

A first connection electrode CNE1, a second insulating layer PAS2, a second connection electrode CNE2, and a third insulating layer PAS3 may be formed on the target substrate 150 once the light-emitting element solvent is removed.

Figure 18:
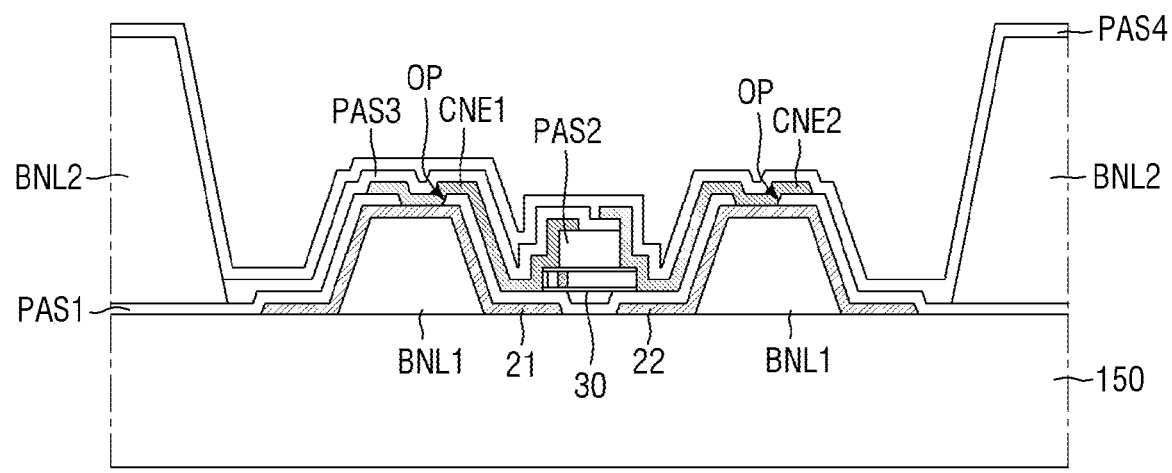

Referring to FIG. 18, an insulating material is stacked on the target substrate 150, on which the first insulating layer PAS1 and the light-emitting element 30 are disposed, and patterned to form the second insulating layer PAS2 covering a portion of the light-emitting element 30, and an opening OP that exposes each of the electrodes 21 and 22 is formed simultaneously with the formation of the second insulating layer PAS2. An electrode material layer is stacked on the target substrate 150 and patterned to form the first connection electrode CNE1. The first connection electrode CNE1 is in contact with one end portion of the light-emitting element 30 while contacting the first electrode 21 through the opening OP. Subsequently, an insulating material is stacked on the target substrate 150 and patterned to form the third insulating layer PAS3 covering the first connection electrode CNE1 and exposing the other end portion of the light-emitting element 30. An electrode material layer is stacked on the target substrate 150 and patterned to form the second connection electrode CNE2. The second connection electrode CNE2 is in contact with the other end portion of the light-emitting element 30 while contacting with the second electrode 22 through the opening OP. Thereafter, a fourth insulating layer PAS4 is formed on the target substrate 150, thereby manufacturing a display device according to an embodiment.

As described above, in the method of manufacturing a display device according to an embodiment, after the light-emitting element ink is sprayed, the process of aligning the light-emitting elements is performed while leveling the light-emitting element ink using the ink leveling device, so that the aggregation of the light-emitting elements may be prevented from occurring in the outer periphery of the subpixel, thereby uniformly aligning the light-emitting elements.

Figure 19:
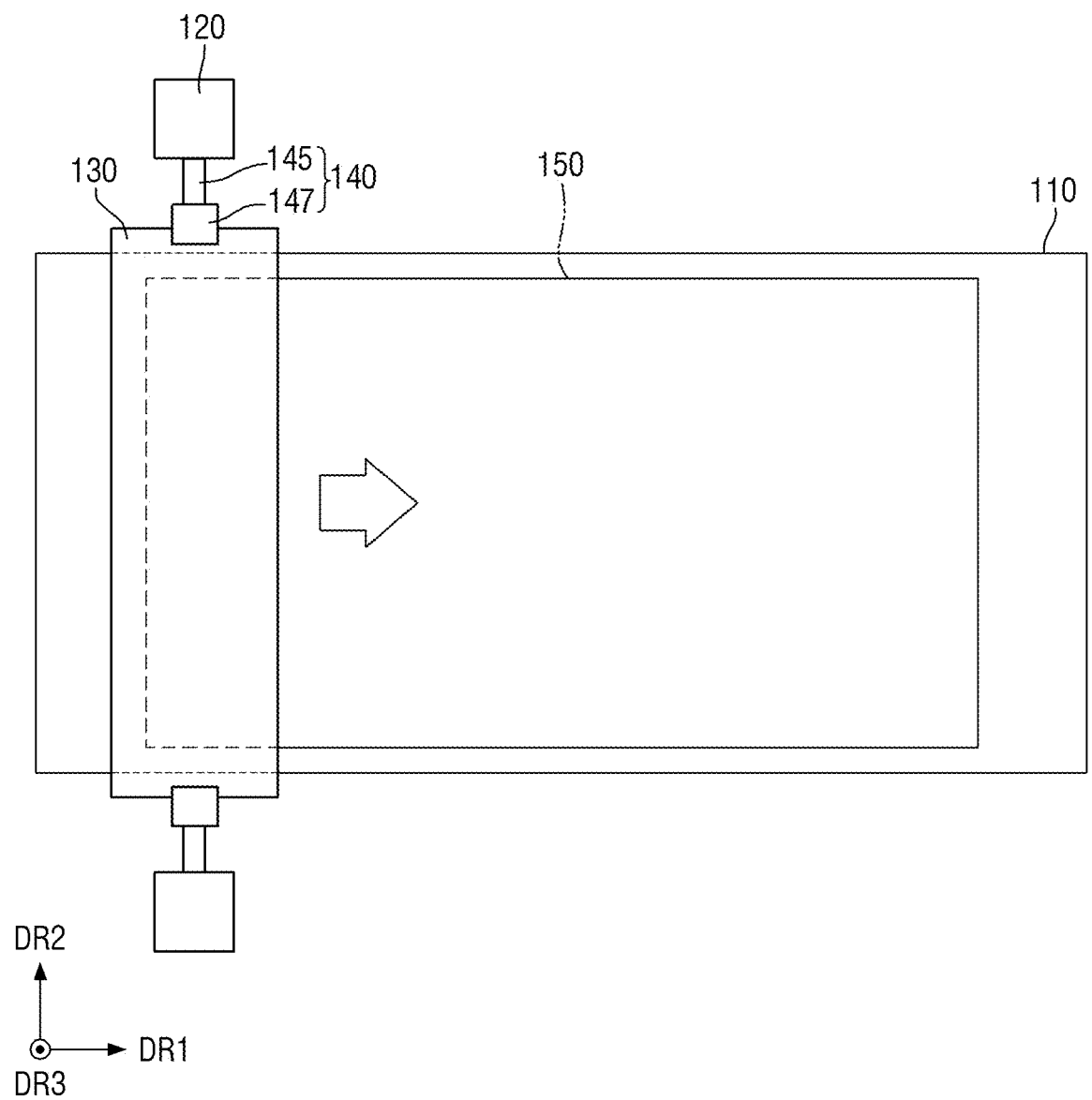
FIGS. 19 to 21 are schematic diagrams illustrating a method of manufacturing a display device according to another embodiment.
Figure 20:
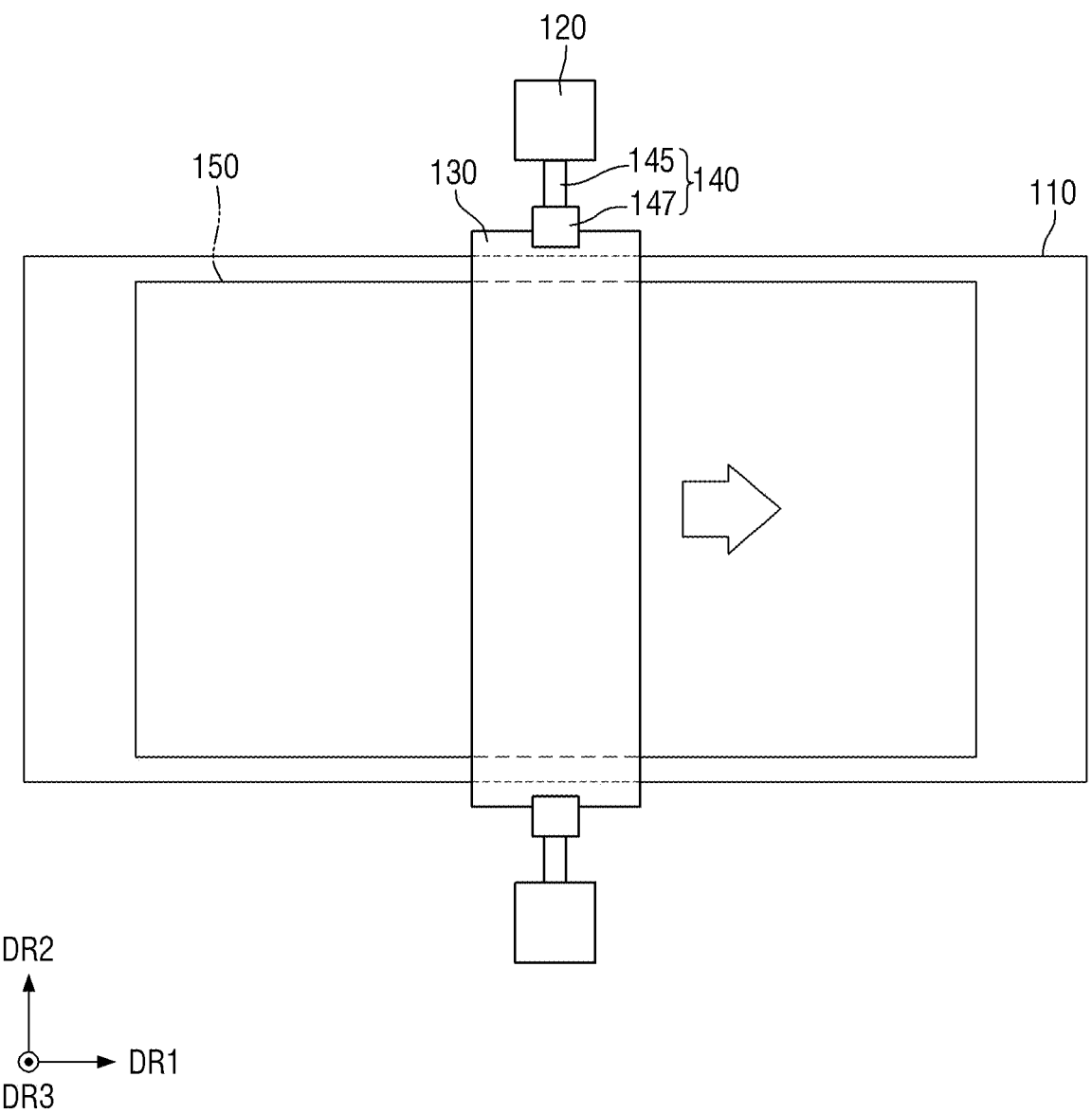
Figure 21:
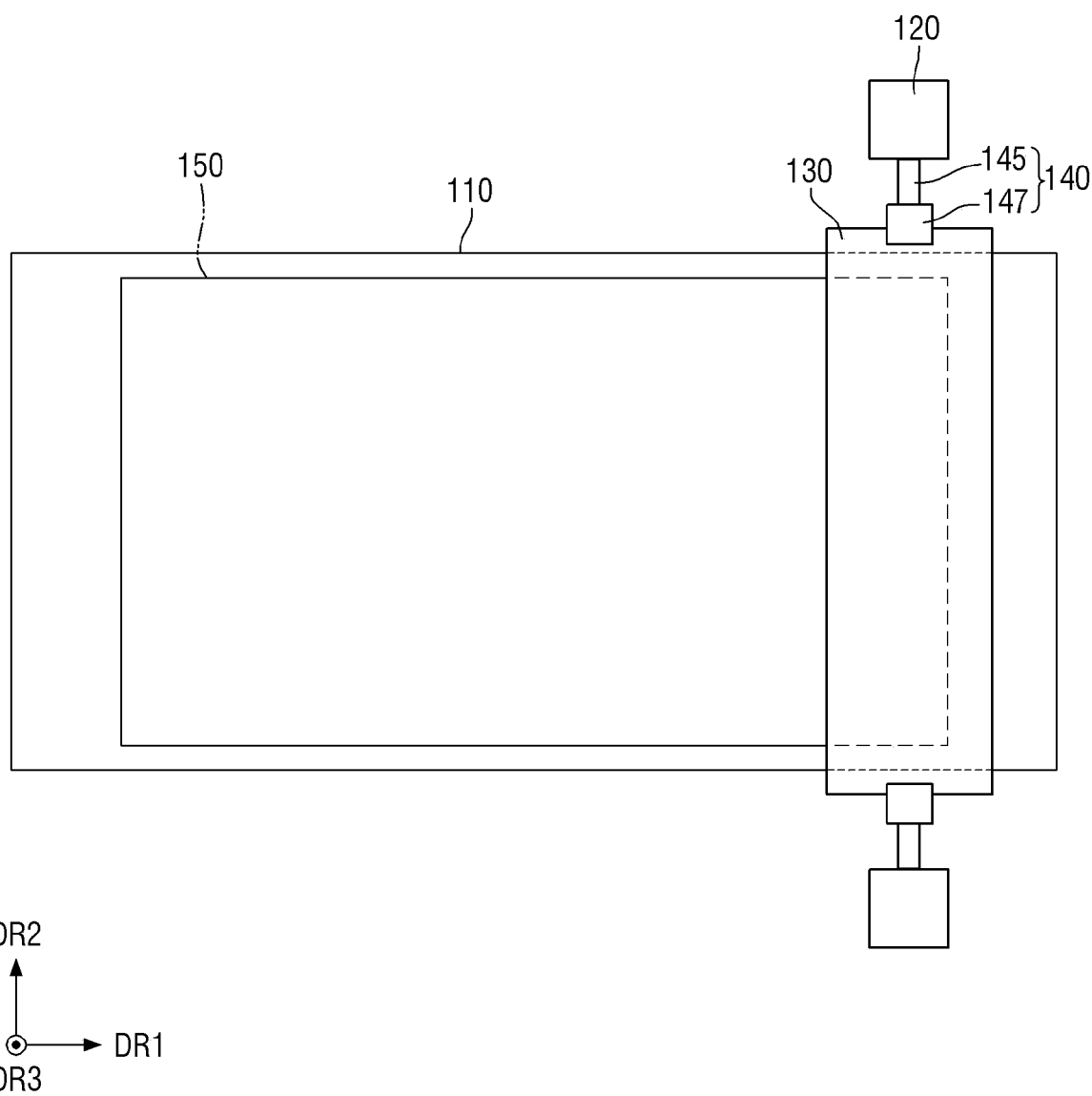

FIGS. 19 to 21 are diagrams illustrating a method of manufacturing a display device according to another embodiment. FIGS. 19 to 21 are diagrams schematically illustrating a state in which a plate 130 of an ink leveling device 100 sequentially presses a target substrate 150.

The method of manufacturing a display device according to another embodiment is different from the embodiment illustrated with reference to FIGS. 11 to 18 in that a size of the plate 130 is less than that of the target substrate 150, and the plate 130 sequentially presses the target substrate 150 for each area. In the following, the differences will be described in detail, and the descriptions of the same components will be omitted.

Referring to FIGS. 19 to 21, the ink leveling device 100 according to an embodiment may include the plate 130 that is smaller than the target substrate 150. A width of the plate 130 in the first direction DR1 may be less than a width of the target substrate 150 in the first direction DR1. A width of the plate 130 in the second direction DR2 may be greater than a width of the target substrate 150 in the second direction DR2.

Like those described above in FIG. 13, when a light-emitting element ink 200 is sprayed onto the target substrate 150, the plate 130 is aligned on one side of the target substrate 150. The plate 130 may be aligned to protrude further outward than the side of the target substrate 150, thereby completely covering one side of the target substrate 150. A moving part 145 of a moving member 140 is moved downward, and one side area of the target substrate 150 is pressed by the plate 130. Since the pressing process has been described above, a description thereof will be omitted. In the embodiment, in the state in which the target substrate 150 is pressed by the plate 130, a process of aligning light-emitting elements is not performed. Subsequently, after the pressing is completed, the moving part 145 of the moving member 140 is moved upward, and the plate 130 is separated from the target substrate 150.

Thereafter, a base frame 120 is moved in the first direction DR1 so that the plate 130 is aligned on an area of the target substrate 150, which has not been pressed. Thereafter, the moving part 145 of the moving member 140 is moved downward, and another area of the target substrate 150 is pressed by the plate 130, and after the pressing is completed, the moving part 145 of the moving member 140 is moved upward, so that the plate 130 is separated from the target substrate 150. By repeating the above processes, the entire area from one side to the other side of the target substrate 150 is divided into areas and sequentially pressed by the plate 130 to level the light-emitting element ink sprayed onto the target substrate 150. In an embodiment, the entire area of the target substrate 150 may be pressed by making the areas pressed by the plate 130 pressing the target substrate 150 partially overlap each other.

Thereafter, while irradiating UV light onto the target substrate 150, an electric field is generated to align the light-emitting elements, thereby manufacturing a display device.

In the embodiment, the target substrate 150 is divided into the areas and sequentially pressed by the plate 130 that is less in size than the target substrate 150. When the target substrate 150 is large in size, by pressing the target substrate 150 with the plate 130 that is relatively small in size, a pressing pressure of the plate 130 may be uniformly applied to the entire area of the target substrate 150. Accordingly, the light-emitting element ink disposed in the entire area of the target substrate 150 may be uniformly leveled.

Figure 22:
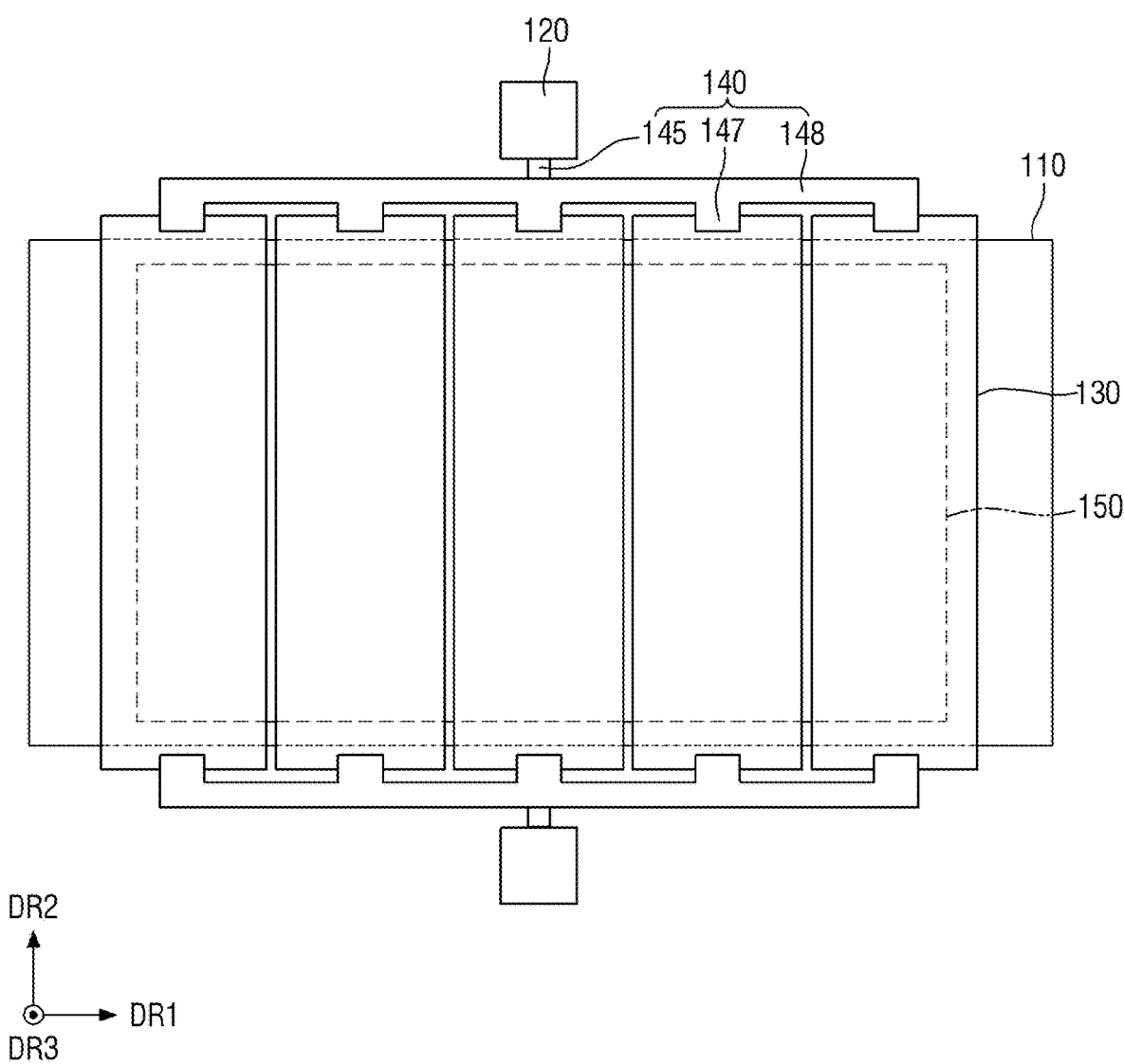
FIG. 22 is a schematic plan view illustrating a method of manufacturing a display device according to still another embodiment.

FIG. 22 is a plan view illustrating a method of manufacturing a display device according to still another embodiment. FIG. 22 is a view schematically illustrating a state in which a target substrate 150 is pressed using the ink leveling device 100 of FIG. 9 described above.

The method of manufacturing a display device according to still another embodiment is different from the embodiments illustrated with reference to FIGS. 11 to 21 in that the target substrate 150 is pressed using divided plates 130. In the following, the differences will be described in detail, and the descriptions of the same components will be omitted.

Referring to FIG. 22, an ink leveling device 100 according to an embodiment may include a supporting part 148 coupled to a moving part 145 and multiple fixing parts 147 extending from the supporting part 148. The supporting part 148 may have a length extending in the first direction DR1 to support multiple plates 130. The fixing parts 147 may be provided in the same number as the number of plates 130 to support each of the plates 130. The plates 130 may be disposed to be spaced apart from each other in the first direction DR1, and the spaced distance may be very small. The plates 130 may each be formed to have a size less than that of the target substrate 150, but the total size of the plates 130 together may be greater than the size of the target substrate 150 so that the entire target substrate 150 is covered.

Like those described above in FIG. 13, when a light-emitting element ink 200 is sprayed onto the target substrate 150, the plates 130 are aligned on the target substrate 150. The plates 130 may cover the target substrate 150. The moving part 145 of a moving member 140 is moved downward, and one side area of the target substrate 150 is pressed by the plates 130. The light-emitting element ink sprayed onto the target substrate 150 may be entirely leveled by being pressed by the plates 130. As described above in FIG. 16, the light-emitting elements are aligned by applying an electric field while irradiating UV light through a UV irradiation device. Subsequently, after the alignment of the light-emitting elements is completed, the moving part 145 of the moving member 140 is moved upward, and the plates 130 are separated from the target substrate 150.

In the embodiment, by pressing the entire area of the target substrate 150 using the divided plates 130, pressing pressures from the multiple plates 130 may be uniformly applied to the entire area of the target substrate 150. Accordingly, the light-emitting element ink disposed in the entire area of the target substrate 150 may be uniformly leveled.

Hereinafter, the embodiments will be described in more detail using Manufacturing Examples and Experimental Examples.

Manufacturing Example 1

Manufacture of Target Substrate Samples

A substrate sample #1 and a substrate sample #2 were prepared by spraying light-emitting element ink including light-emitting elements on target substrates as shown in FIG. 12.

Manufacturing Example 2

Manufacture of Display Devices

Display device samples #1 and #2 as shown in FIG. 18 were prepared respectively using the substrate samples #1 and #2 manufactured in Manufacturing Example 1.

Experimental Example 1

Figure 23:
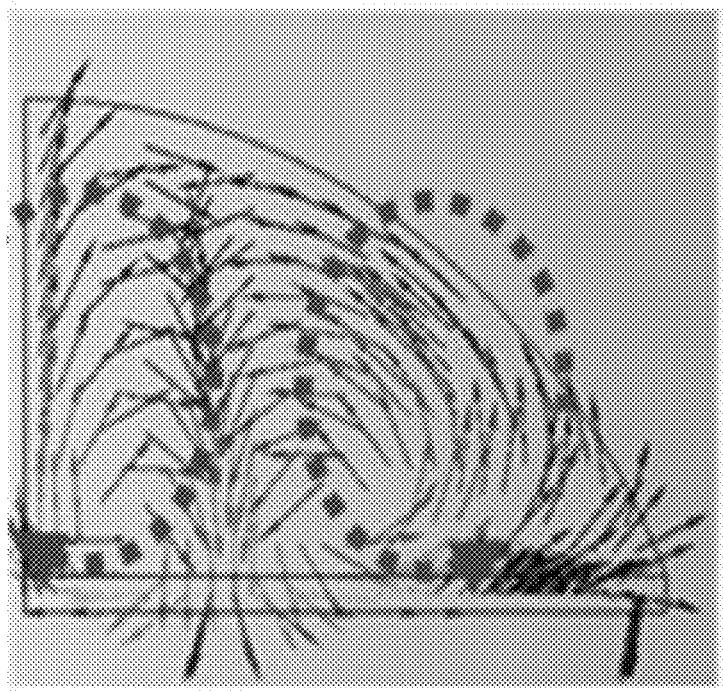
FIG. 23 is an image illustrating the flow of light-emitting element ink for a substrate sample #1.
Figure 24:
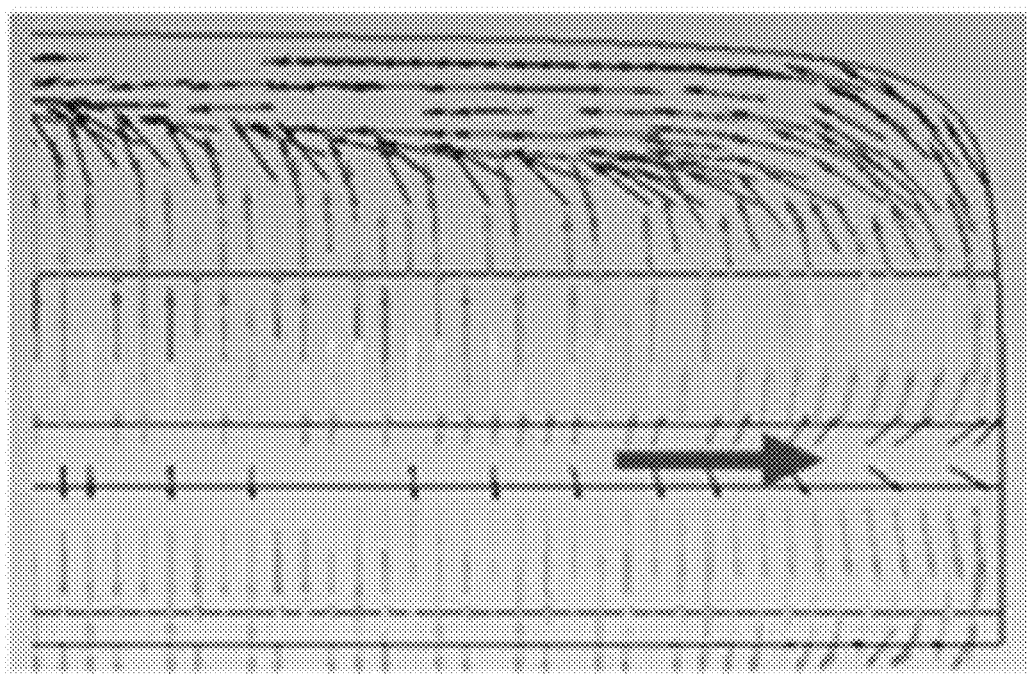
FIG. 24 is an image illustrating the flow of light-emitting element ink for a substrate sample #2.

Measurement of Flow of Light-Emitting Element Ink with or without Leveling Light-Emitting Element Ink A flow of light-emitting element ink was measured by applying an electric field to the substrate sample #1. A flow of light-emitting element ink was measured by applying an electric field in a state in which the light-emitting element ink is leveled by pressing the substrate sample #2 using a plate of an ink leveling device. Images obtained by simulating the flows of the light-emitting element ink are respectively illustrated in FIGS. 23 and 24. FIG. 23 is an image illustrating the flow of the light-emitting element ink for the substrate sample #1. FIG. 24 is an image illustrating the flow of the light-emitting element ink for the substrate sample #2.

Referring to FIG. 23, the substrate sample #1 had a strong flow in an outer periphery of the light-emitting element ink. On the other hand, referring to FIG. 24, the substrate sample #2 had the same flow in a center portion and an outer periphery of the light-emitting element ink.

Experimental Example 2

Measurement of Alignment of Light-Emitting Element of Display Device

Figure 25:
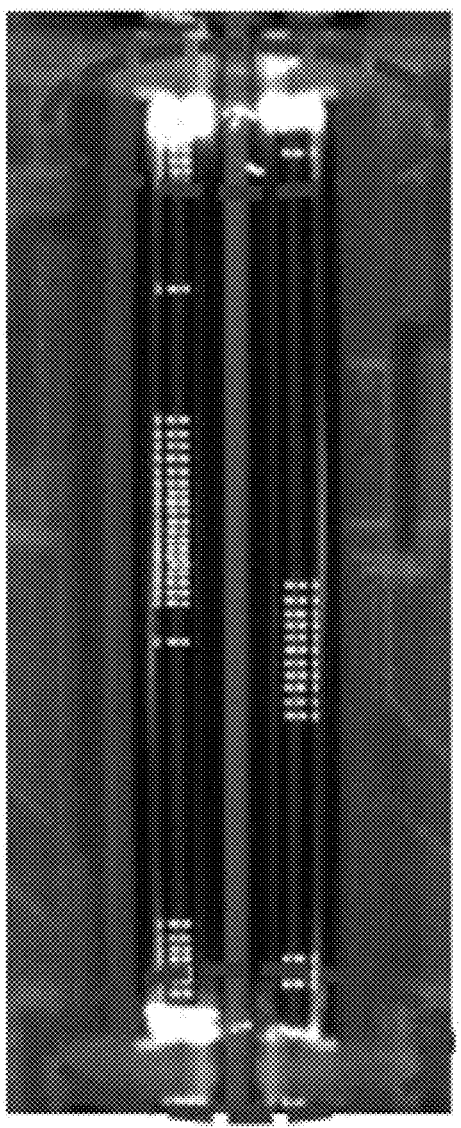
FIG. 25 is a light emission image of subpixels of a display device for a display device sample #1.
Figure 26:
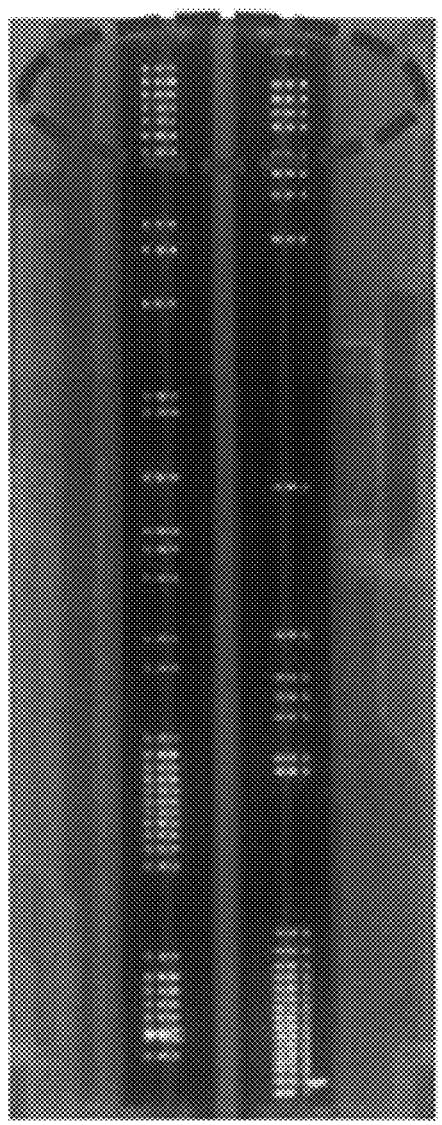
FIG. 26 is a light emission image of subpixels of a display device for a display device sample #2.

After emitting the display device samples #1 and #2 manufactured in Manufacturing Example 2 images obtained by measuring the light emission of subpixels are illustrated in FIGS. 25 and 26, respectively. FIG. 25 is a light emission image of the subpixels for the display device sample #1. FIG. 26 is a light emission image of the subpixels for the display device sample #2.

Referring to FIG. 25, in the display device sample #1, the light-emitting elements were concentrated on upper and lower sides of the subpixel, so that the luminance was strong at the upper and lower sides of the subpixel. Referring to FIG. 26, in the display device sample #2, the light-emitting elements were substantially uniformly distributed within the subpixel, thereby exhibiting uniform luminance throughout the subpixel.

Through the above experimental examples, the display device manufactured by the method of manufacturing a display device according to the embodiments may improve alignment and luminance uniformity by making the light-emitting elements uniformly aligned and distributed within the subpixel.

According to an ink leveling device and a method of manufacturing a display device using the same according to embodiments, the alignment of light-emitting elements can be improved, and luminance uniformity can be improved in a subpixel by aligning the light-emitting elements after leveling light-emitting element ink sprayed onto a substrate.

Effects according to the embodiments are not limited by the content above, and other effects may be included in the specification.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. An ink leveling device comprising:
    a stage on which a target substrate is disposed, wherein light-emitting element ink is disposed on the target substrate;
    base frames disposed at sides of the stage;
    moving members coupled to the base frames and movable upward and downward; and
    at least one plate coupled to the moving members and disposed to move relative to the target substrate and light-emitting element ink to press the target substrate.

2. The ink leveling device of claim 1, wherein each of the moving members include:
    a moving part coupled to each of the base frames; and
    a fixing part coupled to the moving part and disposed to fix the at least one plate.

3. The ink leveling device of claim 2, wherein the moving members move upward and downward in a length direction of the base frame.

4. The ink leveling device of claim 1, wherein the at least one plate moves upward and downward according to movement of the moving members to press the target substrate.

5. The ink leveling device of claim 1, wherein a size of the at least one plate is greater than a size of the target substrate.

6. The ink leveling device of claim 1, wherein
    the at least one plate is provided in plural, and
    a size of each of the plurality of plates is smaller than a size of the target substrate.

7. The ink leveling device of claim 6, wherein each of the moving members includes:
    a moving part coupled to each of the base frames;
    a supporting part coupled to the moving part and moving according to movement of the moving part; and
    at least one fixing part extending from the supporting part and disposed to fix the at least one plate.

8. The ink leveling device of claim 7, wherein
    the at least one fixing part is provided in plural, and
    the plurality of fixing parts are coupled to the plurality of plates, respectively.

9. A method of manufacturing a display device, the method comprising:
    disposing light-emitting element ink including light-emitting elements on a target substrate;
    pressing the target substrate by moving a plate relative to the target substrate and the light-emitting element ink;
    after pressing the target substrate, aligning the light-emitting elements by forming an electric field on the target substrate and irradiating ultraviolet light on the target substrate; and
    after aligning the light-emitting elements, separating the plate from the target substrate.

10. The method of claim 9, wherein
    the light-emitting element ink includes a solvent and the light-emitting elements dispersed in the solvent, and
    the disposing of the light-emitting element ink on the target substrate includes inkjet printing.

11. The method of claim 9, wherein the target substrate includes first patterns formed in parallel, a first electrode and a second electrode disposed on the first patterns, a first insulating layer covering the first electrode and the second electrode, and second patterns disposed on the first insulating layer and that partition a predetermined area.

12. The method of claim 11, wherein the aligning of the light-emitting elements includes:
    generating the electric field by the first electrode and the second electrode; and
    disposing end portions of each of the light-emitting elements on the first electrode and the second electrode, respectively, by use of the electric field.

13. The method of claim 11, wherein the pressing of the target substrate includes:
    moving a moving member downward to the target substrate such that a plate coupled to the moving member contacts the target substrate; and
    pressing the target substrate and the light-emitting element ink by the plate.

14. The method of claim 13, wherein
    the plate contacts the second patterns of the target substrate and the light-emitting element ink, and
    the light-emitting element ink is leveled between the second patterns by the pressing of the plate.

15. The method of claim 13, wherein the separating of the plate from the target substrate includes moving the moving member upward to separate the plate coupled to the moving member from the target substrate.

16. The method of claim 13, wherein
    a size of the plate is greater than a size of the target substrate.

17. The method of claim 13, wherein
    a plurality of plates are coupled to the moving member, and
    a total size of the plurality of plates is great than a size of the target substrate.

18. A method of manufacturing a display device, the method comprising:
    disposing light-emitting element ink including light-emitting elements on a target substrate;
    sequentially pressing areas of the target substrate by moving a plate relative to the target substrate and light-emitting element ink;
    separating the plate from the target substrate; and
    after separating the plate from the target substrate, aligning the light-emitting elements by forming an electric field on the target substrate and irradiating ultraviolet light.

19. The method of claim 18, wherein
    a size of the plate is smaller than a size of the target substrate, and
    the areas of the target substrate are sequentially pressed from one side of the target substrate to another side of the target substrate.

20. The method of claim 19, wherein the aligning of the light-emitting elements is performed after the separating of the plate from the target substrate.

* * * * *